United States Patent
Conn

(10) Patent No.: US 7,829,994 B2
(45) Date of Patent: Nov. 9, 2010

(54) SEMICONDUCTOR SUBSTRATE ELASTOMERIC STACK

(75) Inventor: Robert O. Conn, Laupahoehoe, HI (US)

(73) Assignee: siXis, Inc., Research Triangle Park, NC (US)

( * ) Notice: Subject to any disclaimer, the term of this patent is extended or adjusted under 35 U.S.C. 154(b) by 198 days.

(21) Appl. No.: 11/975,007

(22) Filed: Oct. 16, 2007

(65) Prior Publication Data

US 2009/0079058 A1   Mar. 26, 2009

Related U.S. Application Data

(60) Provisional application No. 60/995,194, filed on Sep. 24, 2007.

(51) Int. Cl.
   *H01L 23/02*   (2006.01)
(52) U.S. Cl. .............. 257/686; 257/691; 257/417; 257/E21.514; 257/E21.515; 257/E23.085
(58) Field of Classification Search .............. 257/686, 257/691, E21.514, E21.515, E23.085, 417; 361/679.53, 679.02
   See application file for complete search history.

(56) References Cited

U.S. PATENT DOCUMENTS

| | | | |
|---|---|---|---|
| 5,172,310 A | 12/1992 | Deam et al. | 363/144 |
| 5,208,491 A | 5/1993 | Ebeling et al. | 326/41 |
| 5,236,118 A | 8/1993 | Bower et al. | 228/193 |
| 5,511,428 A | 4/1996 | Goldberg et al. | 731/777 |
| 5,655,290 A | 8/1997 | Moresco et al. | 29/830 |
| 5,790,771 A | 8/1998 | Culbertson et al. | 714/3 |
| 5,805,533 A * | 9/1998 | Daigle et al. | 368/226 |
| 5,834,705 A | 11/1998 | Jonaidi | 174/261 |
| 5,891,761 A * | 4/1999 | Vindasius et al. | 438/109 |
| 5,949,030 A | 9/1999 | Fasano et al. | 174/262 |
| 6,206,705 B1 | 3/2001 | Bolotin et al. | 439/69 |
| 6,221,769 B1 | 4/2001 | Dhong et al. | 438/667 |
| 6,259,160 B1 | 7/2001 | Lopatin et al. | 257/762 |
| 6,379,982 B1 | 4/2002 | Ahn et al. | 438/14 |
| 6,555,467 B2 | 4/2003 | Hsu et al. | 438/633 |
| 6,598,216 B2 | 7/2003 | Chan et al. | 716/13 |
| 6,650,301 B1 | 11/2003 | Zimmerman | 343/803 |
| 6,660,564 B2 | 12/2003 | Brady | 438/119 |
| 6,694,464 B1 | 2/2004 | Quayle et al. | 714/725 |
| 6,768,205 B2 | 7/2004 | Taniguchi et al. | 257/774 |

(Continued)

*Primary Examiner*—Davienne Monbleau
*Assistant Examiner*—Hajar Kolahdouzan
(74) *Attorney, Agent, or Firm*—Imperium Patent Works; T. Lester Wallace; Joseph S. Spano

(57) ABSTRACT

A reconfigurable high performance computer occupies less than 360 cubic inches and has an approximate compute power of 0.7 teraflops per second while consuming less than 1000 watts. The computer includes a novel stack of semiconductor substrate assemblies. Some semiconductor substrate assemblies involve field programmable gate array (FPGA) dice that are directly surface mounted, as bare die, to a semiconductor substrate. Other semiconductor substrate assemblies of the stack involve bare memory integrated circuit dice that are directly surface mounted to a semiconductor substrate. Elastomeric connectors interconnect adjacent semiconductor substrates proceeding down the stack. Tines of novel comb-shaped power bus bar assembly structures extend into the stack to supply DC supply voltages. The supply voltages are supplied from bus bars, through vias in the semiconductor substrates, and to the integrated circuits on the other side of the substrates. The power bus bars also serve as capacitors and guides for liquid coolant.

15 Claims, 30 Drawing Sheets

U.S. PATENT DOCUMENTS

| | | |
|---|---|---|
| 7,048,548 B2 | 5/2006 | Mattieu et al. ................. 439/66 |
| 7,409,610 B1 | 8/2008 | Drimer ....................... 714/725 |
| 2002/0134581 A1 | 9/2002 | Figueroa et al. ............. 174/260 |
| 2002/0134685 A1 | 9/2002 | Chakravorty et al. ........ 205/125 |
| 2002/0163062 A1 | 11/2002 | Wang et al. .................. 257/641 |
| 2003/0107117 A1 | 6/2003 | Antonell et al. ............. 257/684 |
| 2004/0038195 A1 | 2/2004 | Nerenberg et al. ............. 435/4 |
| 2004/0179344 A1 | 9/2004 | Uchida et al. ............... 361/777 |
| 2005/0104221 A1 | 5/2005 | Memis ....................... 257/778 |
| 2006/0027934 A1 | 2/2006 | Edelstein et al. ............ 257/774 |
| 2006/0125094 A1* | 6/2006 | Lin ........................... 257/734 |
| 2006/0170110 A1 | 8/2006 | Akram et al. ................ 257/774 |
| 2006/0190846 A1 | 8/2006 | Hichri et al. .................... 716/1 |
| 2006/0226450 A1* | 10/2006 | Furuta et al. ................ 257/208 |
| 2007/0012475 A1* | 1/2007 | Kawaguchi et al. ......... 174/255 |
| 2007/0210400 A1* | 9/2007 | Moribayashi et al. ....... 257/440 |
| 2008/0054486 A1 | 3/2008 | Murayama et al. .......... 257/774 |
| 2008/0253085 A1* | 10/2008 | Soffer ........................ 361/687 |

\* cited by examiner 0.7 TFlops/sec (DP)
60 Tops/sec (16-BIT)
1000 WATTS
9 INCHES HIGH X 5 INCHES WIDE X 8 INCHES DEEP

SEMICONDUCTOR SUBSTRATE STACK
HIGH PERFORMANCE COMPUTER

POWER DISTRIBUTION PCB ASSEMBLY

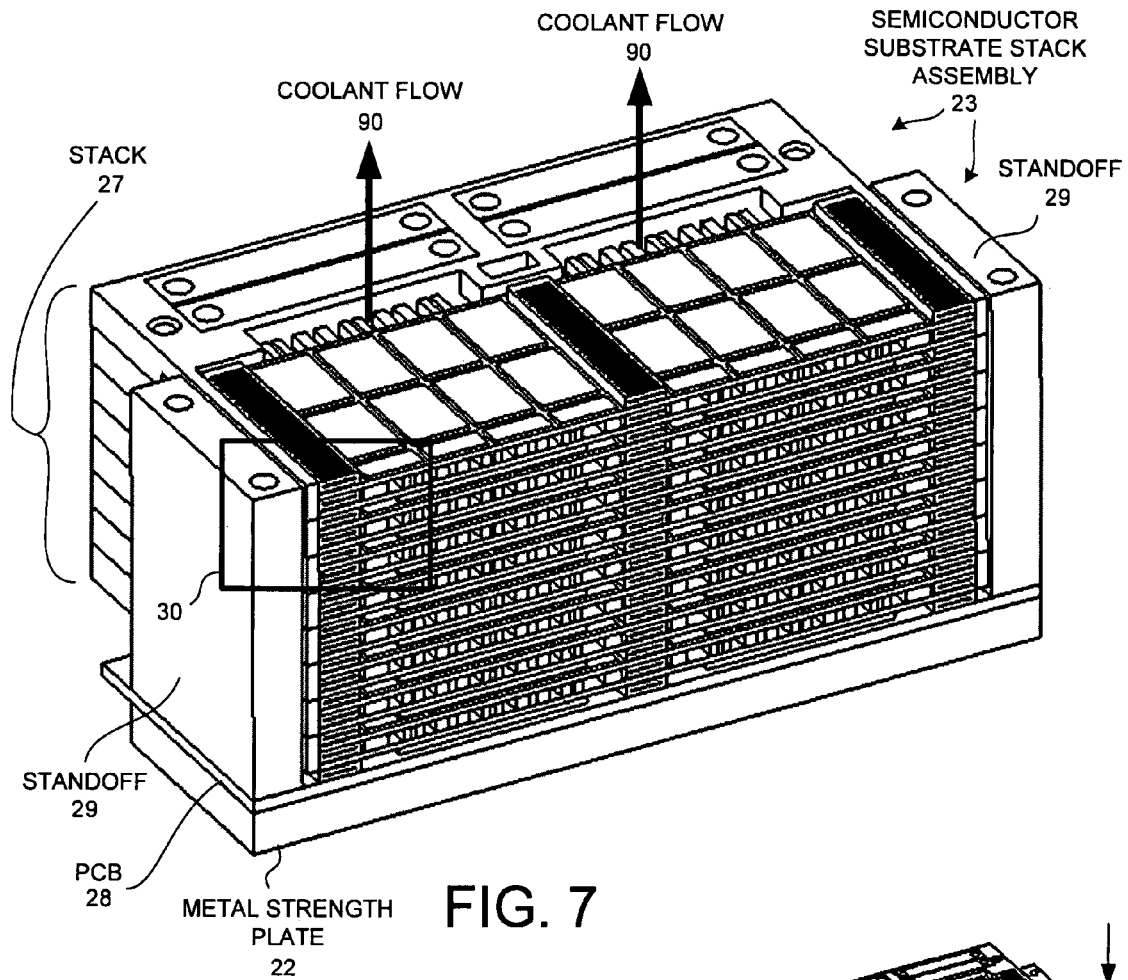
FIG. 7
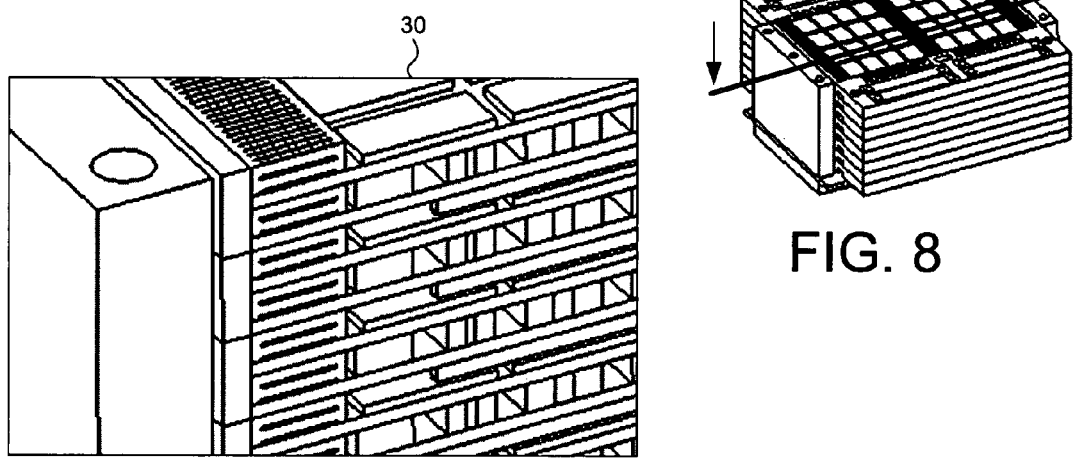
FIG. 8
FIG. 9

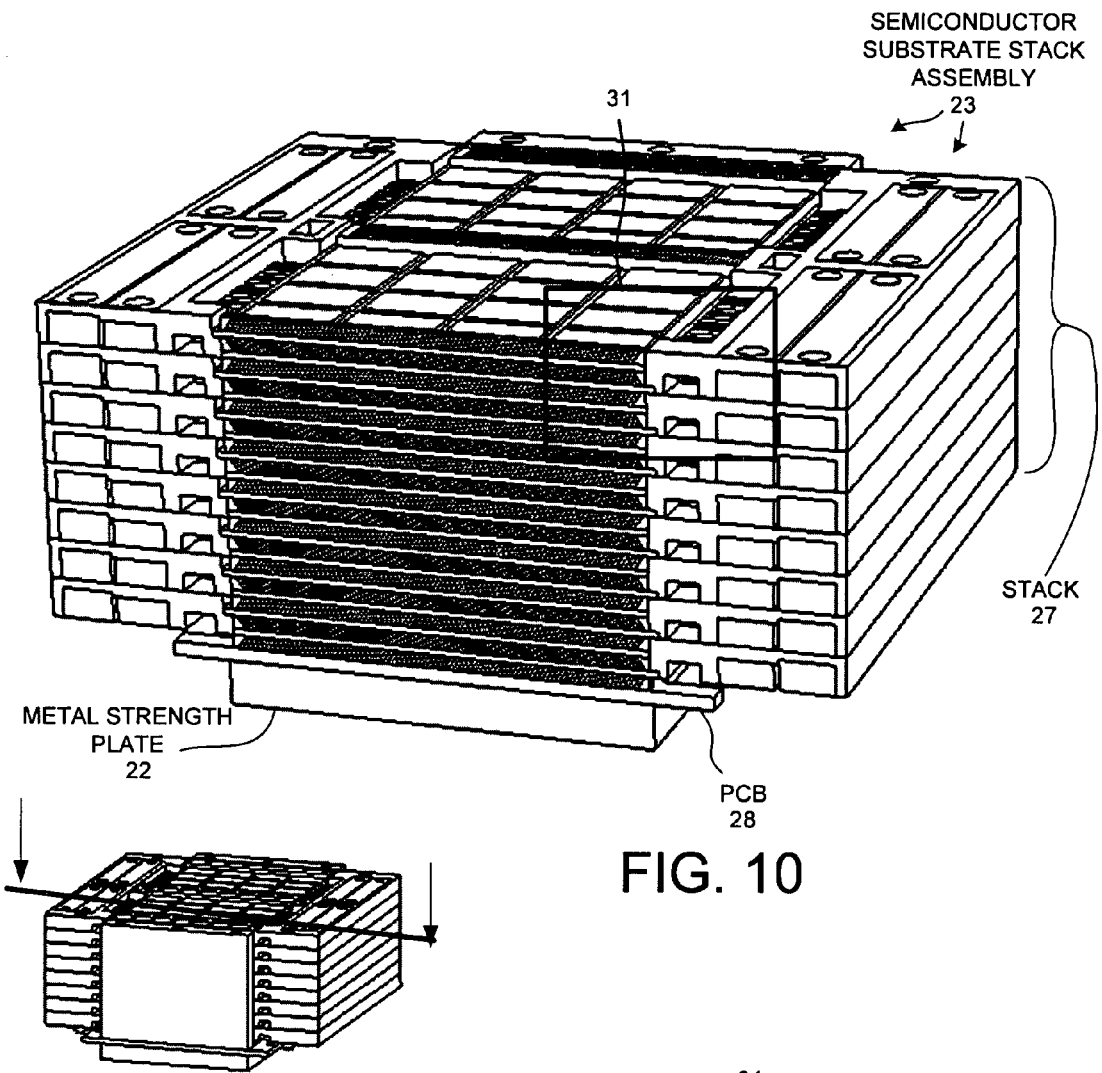
FIG. 10
FIG. 11
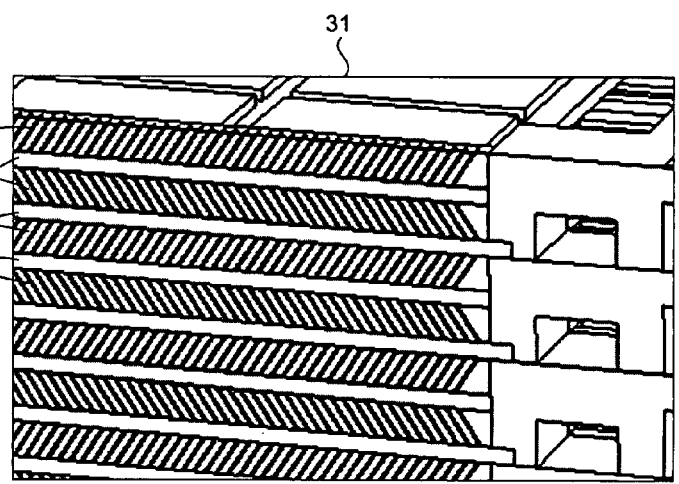
FIG. 12

PADS ON THE BOTTOM SURFACE OF SEMICONDUCTOR SUBSTRATE ASSEMBLY 49 MATCH UP WITH CONDUCTIVE FILAMENTS OF ELASTOMERIC CONNECTOR 66

SEMICONDUCTOR SUBSTRATE ASSEMBLY (FPGA)

SEMICONDUCTOR SUBSTRATE ASSEMBLY (MEMORY)

COMB-SHAPED POWER BUS BAR
ASSEMBLY STRUCTURE

EXPLODED VIEW OF POWER BUS BAR
ASSEMBLY STRUCTURE

MORE DETAILED VIEW OF INSULATIVE GUIDE TRAY

FLOW OF LIQUID COOLANT
THROUGH STACK

BLOCK DIAGRAM OF THE
SEMICONDUCTOR SUBSTRATE
STACK

BLOCK DIAGRAM OF THE
SEMICONDUCTOR SUBSTRATE
STACK

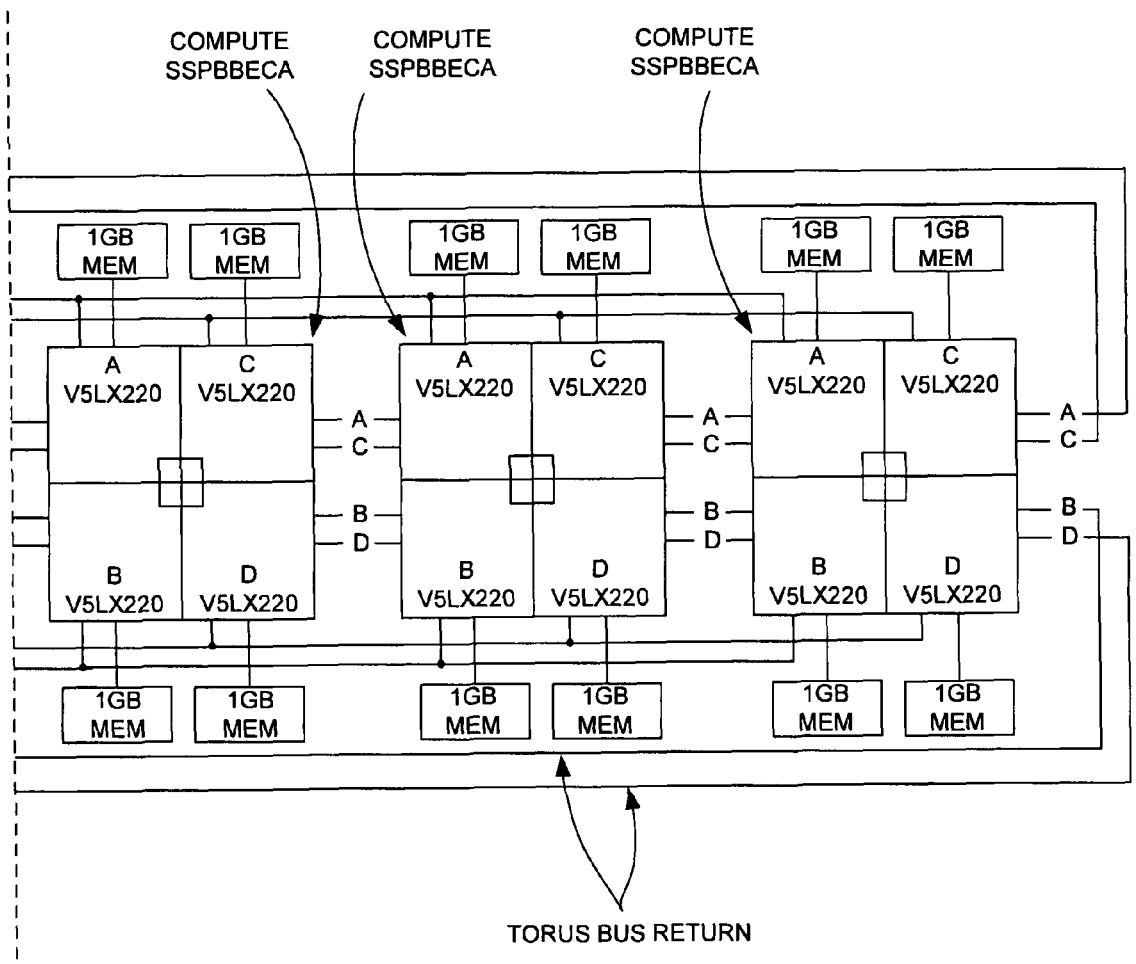
BLOCK DIAGRAM OF THE
SEMICONDUCTOR SUBSTRATE
STACK
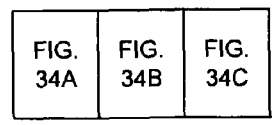
FIG. 34
FIG. 34C

BLOCK DIAGRAM OF ONE
COMPUTE SEMICONDUCTOR
SUBSTRATE ASSEMBLY

BLOCK DIAGRAM OF
1/4 COMPUTE SEMICONDUCTOR
SUBSTRATE ASSEMBLY

PHYSICAL LAYOUT OF ONE COMPUTE
SEMICONDUCTOR SUBSTRATE ASSEMBLY

USING LOCAL DEFECT MEMORIES TO STORE RESOURCE
INFORMATION AND UPDATE SYSTEM DESCRIPTION

SEMICONDUCTOR SUBSTRATE CROSS-SECTION
SHOWING SEPARATELY FABRICATED LAYERS FUSION
BONDED TOGETHER

CROSS SECTIONAL VIEW OF SUBSTRATE WITH COPPER CONDUCTOR SURROUNDED BY SOFT DIELECTRIC MATERIAL

SEMICONDUCTOR SUBSTRATE ELASTOMERIC STACK

CROSS REFERENCE TO RELATED APPLICATION

This application claims the benefit under 35 U.S.C. §119 from provisional U.S. patent application Ser. No. 60/995,194, entitled "Semiconductor Substrate Stack High Performance Computer," by Robert O. Conn, filed on Sep. 24, 2007, the subject matter of which is incorporated herein by reference.

TECHNICAL FIELD

The described embodiments relate to high performance computing, and more particularly to reconfigurable high performance computing.

BACKGROUND INFORMATION

There are many uses for computers having very high computational powers. Uses include simulating how large physical systems act and interact, performing circuit simulation of very large integrated circuits, wind tunnel simulation, 3-dimensional modeling, solving stream matching problems and nearest neighbor problems, DNA and protein sequencing, and solving many other problems in industry and the sciences.

Not only are there many needs for computers having high computational powers, but there are also many needs for a reliable computer having a very high computational power that also can perform its functions in a small volume. One example of an application for such a high performance computer is an unmanned aerial vehicle (UAV) of the type typically used for surveillance and reconnaissance and remote sensing. Such a UAV has both civil and military applications. In one typical usage, the UAV flies over an area and uses a multitude of sensors, detectors and cameras to gather information about the area. The collected information is then often analyzed, at least to some degree, to determine whether an additional action should be taken. If an object of interest is determined to be present, for example, then the UAV may be directed to circle the object of interest and gather more information. Due to weight, size and power limitations attendant in having a high performance computer on board some UAVs, it has sometimes not been possible to provide enough computational power within the UAV to determine in real time whether the information being gathered is indicative of an object of interest. The information therefore to be analyzed on the ground. Video information is typically analyzed by humans to determine whether the video contains images of any objects of interest. Large computers located on the ground may assist in this operation. Unfortunately, the communication bandwidth between the flying UAV and the control base on the ground where the analysis is to be performed is often inadequate to stream all the gathered information back to the control base for analysis. It is therefore often necessary to have the UAV record the gathered information on-board the UAV, and to have the UAV return to the control base. The gathered information is then downloaded from the UAV and is analyzed. If an object of interest is identified, then the UAV may be made to fly back over the area of the object of interest. Due to the delay in this process, the object may have moved and may no longer be available for surveillance by the time the UAV returns. The delay and cost associated with having to analyze the gathered information on the ground is undesirable.

If, on the other hand, a computer having a computational power of 0.5 teraflops per second and high speed input/output capabilities were onboard the UAV, then the UAV could prescreen and analyze the information being gathered in real time. If the on-board computer were to detect an object of interest, then the limited communication bandwidth available from the airborne UAV to the control base could be used to send just the gathered information that pertains to the detected object. Upon verification of the object by a human and/or equipment on the ground at the control base, the control base could instruct the UAV to take appropriate action while the UAV is still aloft over the object of interest.

If a computational power of 0.5 teraflops per second were realized using conventional printed circuit boards bearing high performance instruction-executing microprocessors of the Pentium 3 architecture, then the resulting system would require approximately two hundred Pentium 3 microprocessors and would likely occupy a volume of more than twenty-seven thousand cubic inches if realized using rack-mounted equipment. Not only would such a conventional system be unrealistically large and heavy to place in the UAV, but the system would consume over fifteen thousand watts of electrical energy. Providing the regulated DC power necessary to provide this very large amount electrical energy would add tremendous additional weight and size to the system. The conventional computational density of 0.5 teraflops/27,000 cubic inches is too low for the UAV application described above.

A reliable and high performance computer that has a computational power of more than 0.5 teraflops per second, that is reliable, that has high speed input/output capabilities, that consumes a manageable amount of electrical power, and that performs all these functions in a space of less than two hundred cubic inches is desired. Such a computer could be provided in a UAV so that the computer could an detect object of interest in real time while the UAV is flying over the object of interest. In addition, such a high computational density high performance computer would have many other important uses including applications in the sciences, in industry, and in other security and other military applications.

SUMMARY

A reconfigurable high performance computer occupies a volume of less than three-hundred sixty cubic inches and has an approximate compute power of 0.7 teraflops per second (10E12 double precision floating point operations per second), while consuming less than one thousand watts. The high performance computer includes a novel stack of semiconductor substrate assemblies. Some semiconductor substrate assemblies of the stack involve field programmable gate array (FPGA) dice that are directly surface mounted, in bare die form, to a semiconductor substrate. Other semiconductor substrate assemblies of the stack involve bare memory integrated circuit dice that are directly surface mounted to a semiconductor substrate. Each semiconductor substrate may, for example, be five hundred microns thick, two inches wide (more than one inch wide), and three inches long (more than two inches long), and may include long metal signal conductors that are more than one inch long.

The semiconductor substrates are stacked so that anisotropic elastomeric connectors are sandwiched between each pair of adjacent semiconductor substrate assemblies proceeding down the stack. The stack of semiconductor substrate assemblies and elastomeric connectors is compressed so that conductive filaments in the elastomeric connectors make electrical connections to pads on the semiconductor substrates that are pressing on the elastomeric connector from top and bottom. Conductive vias are provided that extend through the semiconductor substrates from a pad on one side of the semiconductor substrate to a corresponding pad on the other side of the semiconductor substrate. Accordingly, the pads and conductive vias and conductive filaments in the elastomeric connectors form a plurality of parallel-extending connections. Each such connection extends from the top semiconductor substrate assembly of the stack, down through the many semiconductor substrates and elastomeric connectors of the stack, and to the semiconductor substrate assembly on the bottom of the stack. These parallel connections form busses through which the various FPGAs and memories of the stack communicate and transfer information and data. One bus is a high bandwidth but relatively high latency torus bus. A second bus is a low latency but relatively low bandwidth shared bus.

Rather than performing a processing function as a sequence of instructions that are fetched, decoded and executed by a microprocessor, the novel high performance computer is usable to perform the processing function without fetching and executing instructions. Rather, reconfigurable FPGA hardware resources are fashioned to perform the various parts of the overall function to be performed. The result is referred to here as a "user design". The design is compiled by a design compiler program that has a system description of the hardware resources available in the stack. The compile operation generates configuration information which, when loaded into the FPGAs of the stack, configures the FPGAs and stack to implement a circuit that performs the function of the user's design. When information is supplied to the stack as configured, the circuit of the user's design carries out its function on the information and generates output data. In one possible example, the function to be performed is the object detection function mentioned in the background section above. The novel high performance computer has high speed input/output connectors and resources to support receiving and processing large streams of information and data.

In one advantageous aspect, long (>two inches) metal conductors on the semiconductor substrates do not break even though the metal of the long conductors expands and contracts with temperature differently than the supporting semiconductor material of the substrate expands and contracts. The long metal conductors are embedded in tubes of soft material. The soft material bends and gives and absorbs differential movement between the long metal conductors and the semiconductor substrate.

In another advantageous aspect, a novel comb-shaped power bus bar assembly structure is provided. Fingers or tines of the power bus bar assembly structure stick into the stack such that the fingers are disposed between each successive pair of semiconductor substrate assemblies. Each finger or tine of the power bus bar assembly structure includes a first solid metal bus bar and a second solid metal bus bar that extends parallel to the first metal bus bar. A supply voltage such as a DC supply voltage is present between the two bus bars. A strip-shaped capacitor is disposed between the two bus bars.

In one novel aspect, adjacent fingers of the bus bar assembly structures provide guides for liquid coolant that is made to flow in the direction of the power bus bars between semiconductor substrates. Each comb-shaped power bus bar assembly structure includes a pair of power bus bar assemblies. Each power bus bar assembly includes a backbone portion from which bus bars extend. The comb-shaped power bus bar assembly structures are stacked within the stack of the high performance computer so that corresponding backbone portions of the comb-shaped power bus bar assembly structures are in stacking contact. Supply current can flow from one backbone portion to the next, up and/or down the stack of backbone portions. In one example, a supply voltage is present on a first stack of backbone portions, and ground-potential is present on a second stack of backbone portions. Each comb-shaped power bus bar assembly structure includes one backbone portion in one stack and another backbone portion in the other stack.

Several of the novel power bus bar assembly structures supply multiple DC supply voltages into the semiconductor substrate stack. DC supply voltages are supplied from power bus bars that contact the backsides of the semiconductor substrates, through the semiconductor substrates through conductive vias, and to the top surfaces of the semiconductor substrates where the FPGA and memory integrated circuits are disposed. In one novel aspect, the semiconductor substrate structures and the power bus bar assembly structures and the elastomeric connectors are held in place and aligned with respect to one another by a novel insulative guide tray. In another novel aspect, each semiconductor substrate involves two layer portions: a thin conductor layers portion and a thick conductor layers portion. The two portions are fabricated separately and are then fusion bonded together to form the semiconductor substrate.

Further details and embodiments and techniques are described in the detailed description below. This summary does not purport to define the invention. The invention is defined by the claims.

BRIEF DESCRIPTION OF THE DRAWINGS

FIG. 7 is a cross-sectional view of the semiconductor substrate stack assembly 23 of FIG. 4.

FIG. 8 is a diagram showing the plane in which the cross-sectional view of FIG. 7 is taken.

FIG. 9 is an expanded view of a part of FIG. 7.

FIG. 10 is a cross-sectional view of the semiconductor stack assembly 23 of FIG. 4, taken in a plane perpendicular to the cross-sectional view plane of FIG. 7.

FIG. 11 is a diagram showing the plane in which the cross-sectional view of FIG. 10 is taken.

FIG. 12 is an expanded view of a part of FIG. 10.

DETAILED DESCRIPTION

Figure 1:
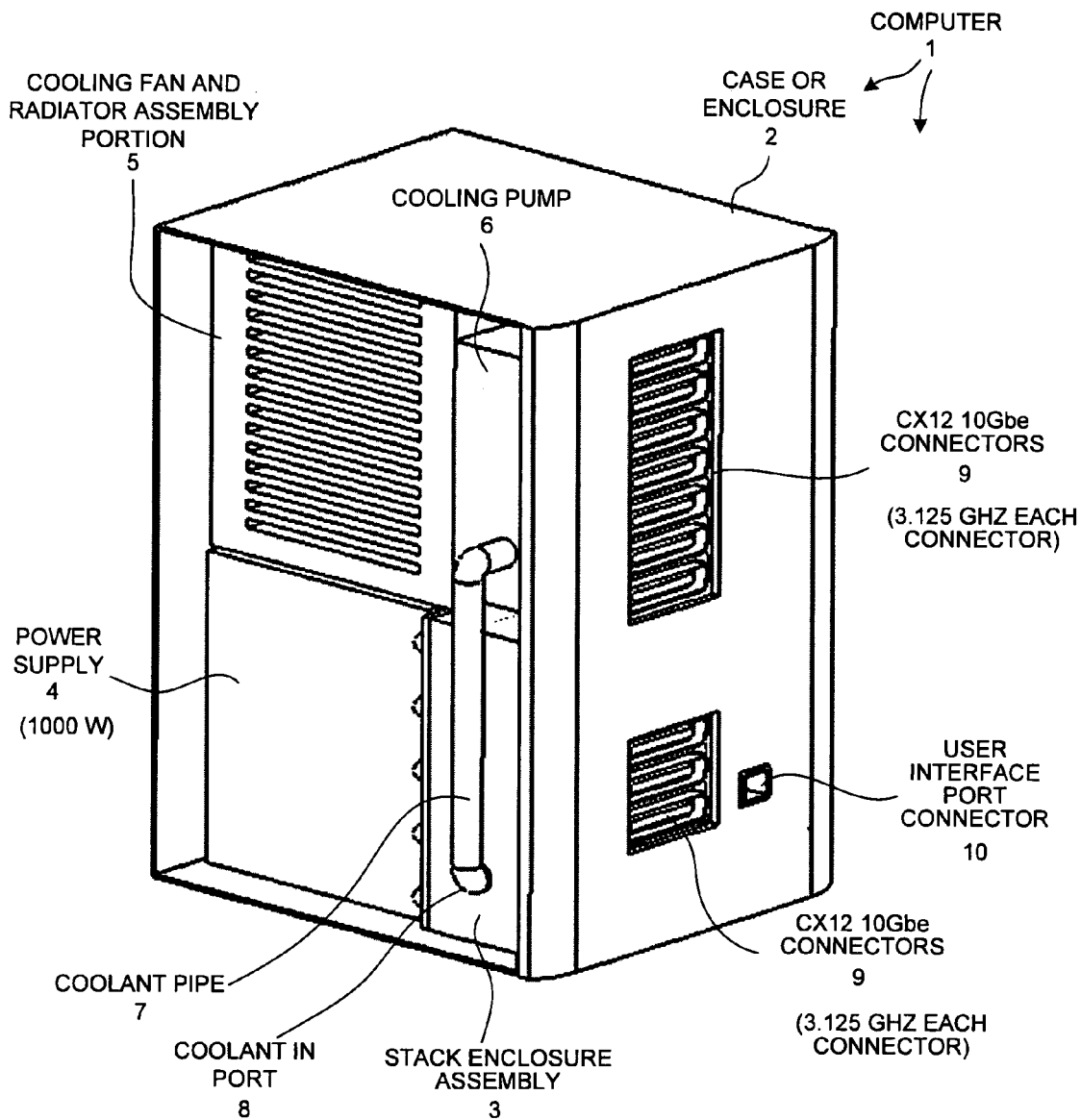
FIG. 1 is a perspective view of a novel semiconductor substrate stack high performance computer 1.

FIG. 1 is a perspective view of a novel semiconductor substrate stack high performance computer 1. Computer 1 has an approximate compute power density of 0.7 teraflops per second (10E12 double precision floating point operations per second) in a volume of less than three-hundred sixty cubic inches, and consumes less than 1000 watts. Computer 1 includes a case or enclosure 2. Case 2 retains a stack enclosure assembly 3, a power supply 4, a cooling fan and radiator assembly portion 5, a cooling pump 6, and an associated coolant pipe 7. Cooling pump 6 circulates liquid coolant, such as a fluorocarbon liquid coolant, from pump 6, through pipe 7, into coolant in port 8, through the stack enclosure assembly 3 to pick up heat, and then through the fan and radiator assembly portion 5 so that heat generated in the stack enclosure assembly 3 can be exhausted from the computer. The coolant liquid is returned from radiator assembly portion 5 to coolant pump 6 for recirculation. With approximately one gallon per minute of circulation and approximately sixty cubic feet per minute of airflow through the radiator, the cooling fan and radiator assembly portion 5 radiates heat at a rate of 0.05 degrees Celsius per watt. Stack enclosure assembly 3, when operating at maximum throughput, dissipates eight hundred watts of power. Given 0.05 degrees Celsius per watt of thermal resistance, the liquid coolant will stabilize at approximately 40 degrees Celsius above ambient.

Power supply 4 receives AC line current from a power cord (not shown) and converts the AC line current into appropriate DC supply voltages. These DC supply voltages are supplied to circuitry within stack enclosure assembly 3. Pin-like power terminals (not shown) extend from one side of stack enclosure assembly 3 and plug into accommodating socket holes (not shown) in a side of power supply 4. It is through these pin-like power terminals and sockets that power supply 4 supplies electrical power to the circuitry within the stack enclosure assembly 3.

As illustrated in FIG. 1, ten high speed input/output (I/O) connectors 9 are disposed in a column so that they are accessible from one side of enclosure 2. These connectors 9 are CX12 10 Gbe connectors. Each CX12 Gbe connector 9 is capable of communicating information either into and/or out of computer 1 at a rate of approximately 120 gigabits per second. This information is typically information and data to be processed by computer 1 and/or the results of the processing of information or data. The high speed connectors allow a combined 1.2 terabits per second of data to be streamed into the computer 1 for processing.

In addition to the high speed I/O connectors 9, computer 1 includes a user interface port connector 10. Connector 10 is an RJ45-type connector. A user typically couples a personal computer or network to computer 1 through this connector 10 so that the user can monitor, control, and/or configure computer 1. For example, it is through this connector 10 that and user uses a graphical user interface (GUI) on the personal computer to cause configuration information to be loaded into computer 1. The configuration information configures many field programmable gate arrays (FPGAs) within the stack enclosure assembly 3.

Figure 2:
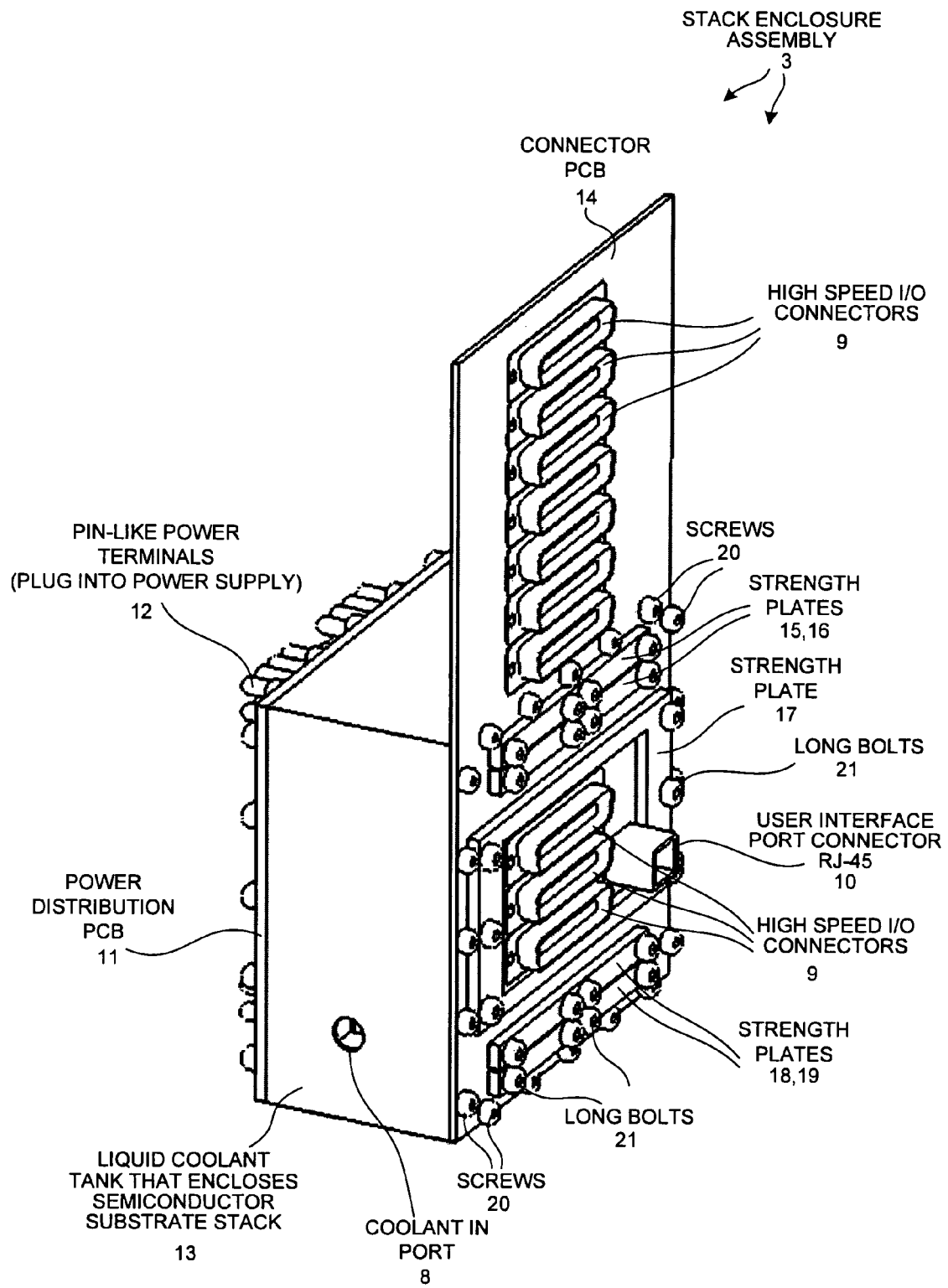
FIG. 2 is a perspective view an enclosure of the stack enclosure assembly 3 of FIG. 1.

FIG. 2 is a perspective view the stack enclosure assembly 3 of FIG. 1. Stack enclosure assembly 3 contains a novel stack of semiconductor substrate assemblies, where semiconductor substrates of the assemblies are interconnected by elastomeric connectors. The stack enclosure assembly 3 illustrated in FIG. 2 is water tight and the coolant liquid is made to flow through the enclosure such that the coolant liquid flows between the various semiconductor substrates of the stack within the stack enclosure assembly 3. Stack enclosure assembly 3 includes a power distribution printed circuit board (PCB) 11, a plurality of pin-like power terminals 12, a liquid coolant tank 13, a connector PCB 14, the ten high-speed I/O connectors 9, the user interface connector 10, a set of strength plates 15-19, and a set of screws 20, and a set of long bolts 21. Screws 20 are disposed in a ring to hold the connector PCB 14 to the liquid coolant tank 13 in a watertight manner. The set of long bolts 21 pulls contents of tank 13 into and toward connector PCB 14 and strength plates 15-19.

Figure 3:
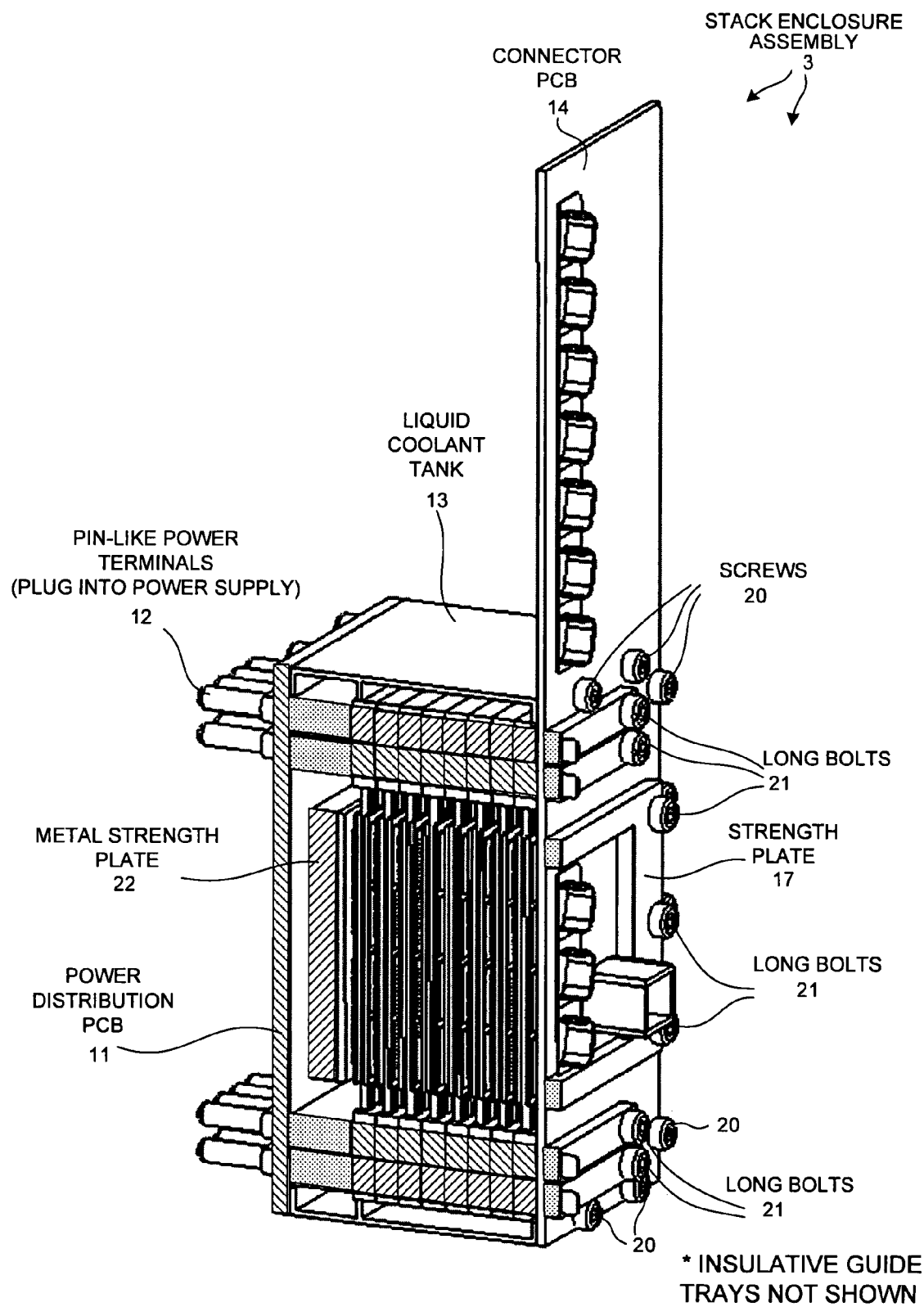
FIG. 3 is a cross-sectional view of FIG. 2.

FIG. 3 is a cross-sectional view of FIG. 2. The long bolts 21 that extend through strength plate 17 pull a metal strength plate 22 in the direction of strength plate 17, thereby sandwiching a semiconductor substrate stack assembly 23 between metal strength plate 22 and connector PCB 14.

Figure 4:
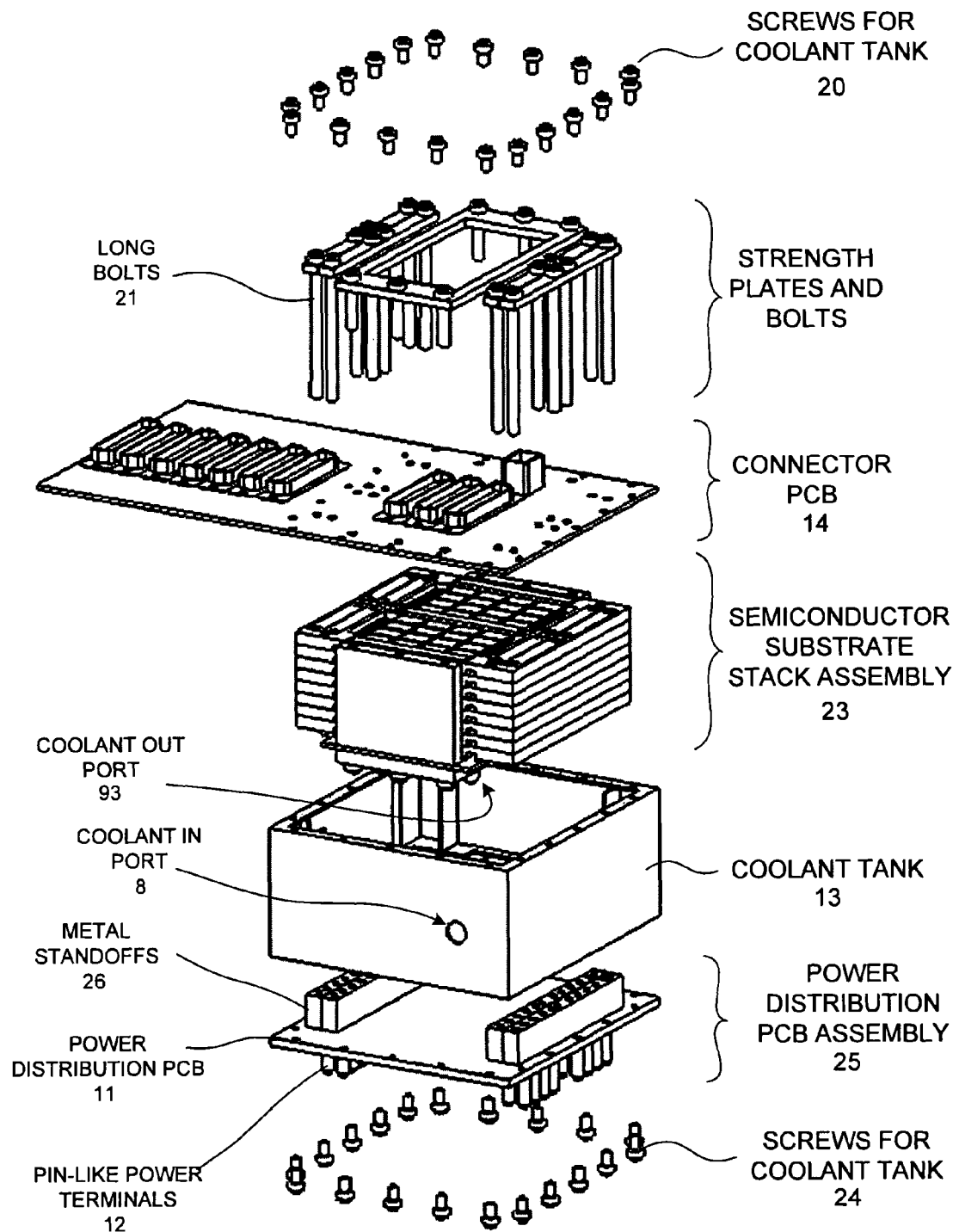
FIG. 4 is an exploded view of the structure of FIG. 2.

FIG. 4 is an exploded view of the stack enclosure assembly 3 of FIG. 2, except that insulative guide trays of the semiconductor substrate stack assembly 23 are shown in FIG. 4. Another set of screws 24 is illustrated. These screws 24 hold the power distribution PCB assembly 25 to coolant tank 13 with a watertight seal between them. Power distribution PCB assembly 25 includes the downward extending pin-like power terminals 12, the power distribution PCB 11, and four metal standoffs 26.

Figure 5:
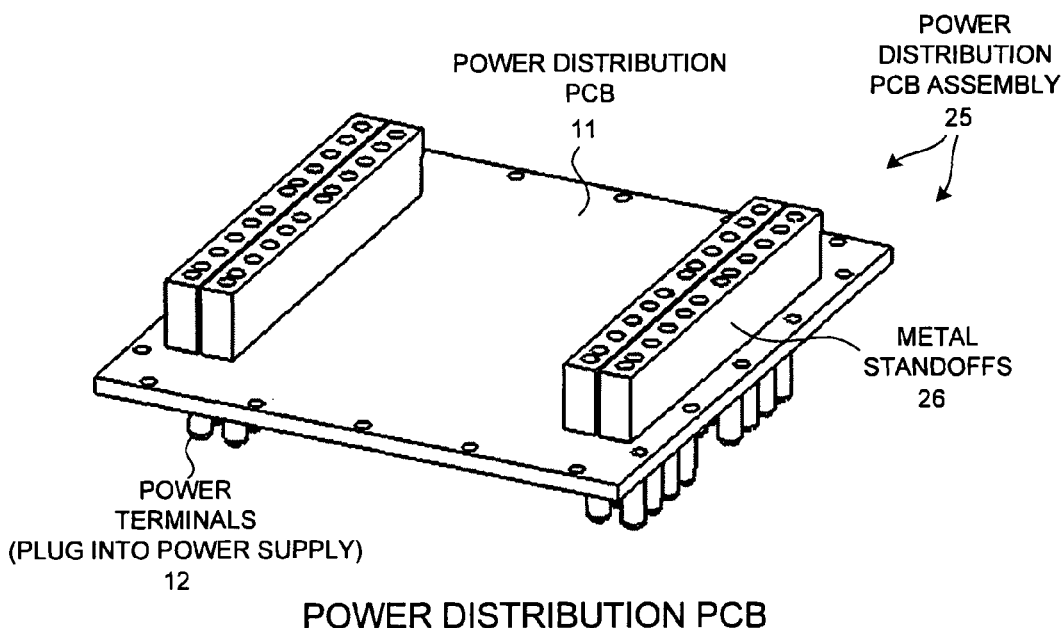
FIG. 5 is a perspective view of the power distribution PCB assembly 25 of FIG. 4.

FIG. 5 is a larger perspective view of the power distribution PCB assembly 25 of FIG. 4.

Figure 6:
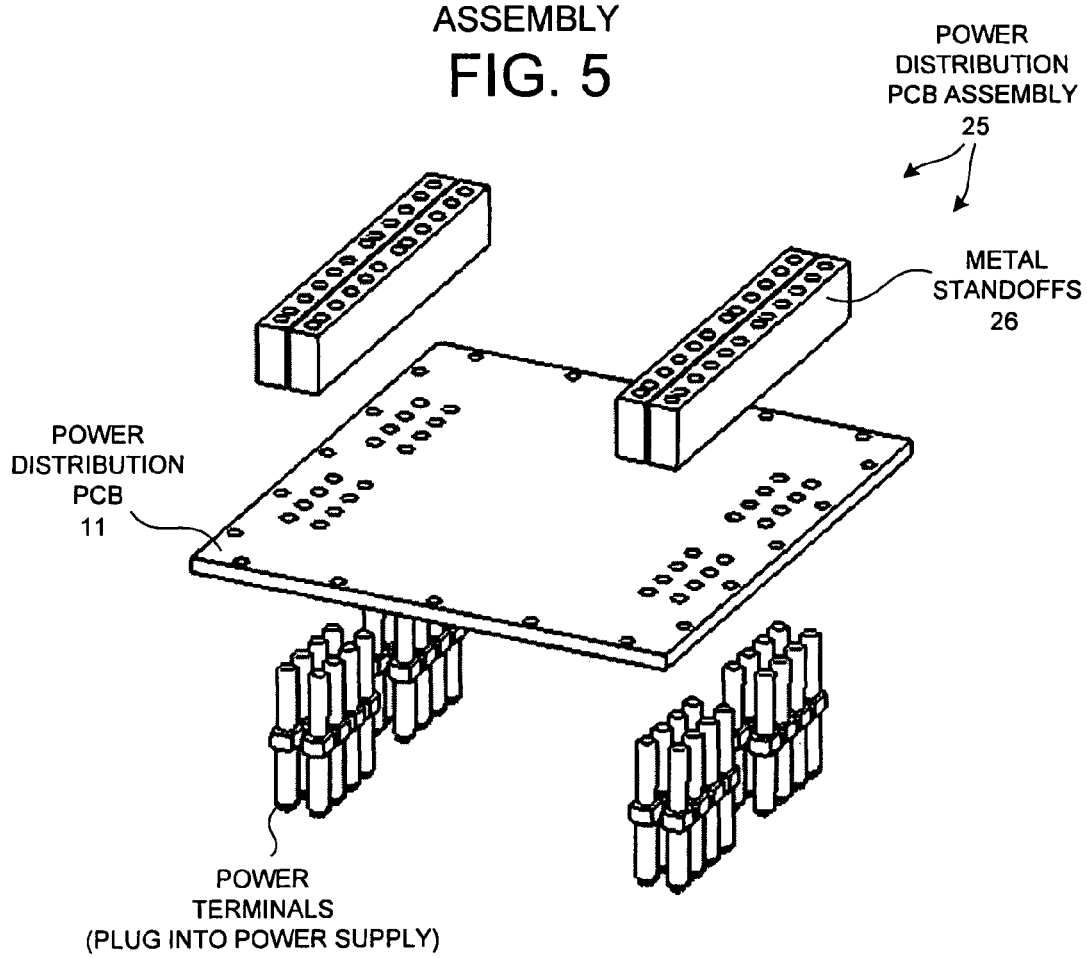
FIG. 6 is an exploded view of the power distribution PCB assembly 25 of FIG. 5.

FIG. 6 is an exploded view of the power distribution PCB assembly 25 of FIG. 5.

FIG. 7 is a cross-sectional view of the semiconductor substrate stack assembly 23. Semiconductor substrate stack assembly 23 includes a stack 27 of semiconductor substrate assemblies in insulative guide trays with intervening elastomeric connectors, the metal strength plate 22, a printed circuit board 28, and a pair of metal standoffs 29.

FIG. 8 is a diagram showing the plane in which the cross-sectional view of FIG. 7 is taken.

FIG. 9 is an expanded view of a part 30 of FIG. 7.

FIG. 10 is a cross-sectional view of the stack 27 taken in a plane perpendicular to the cross-sectional view plane of FIG. 7.

FIG. 11 is a diagram showing the plane in which the cross-sectional view of FIG. 10 is taken.

FIG. 12 is an expanded view of a part 31 of FIG. 10. The angled lines represent conductive fibers in the elastomeric connectors 32. The semiconductor substrate assemblies 33 are offset from one another in the horizontal dimension (left and right in the perspective of the figure), from semiconductor substrate assembly to semiconductor substrate assembly down the stack. These offsets accommodate the offsets due to inclination of the anisotropic elastomeric connectors 32. Each of the elastomeric connectors 32, in the perspective illustrated, has a parallelogram shape and is therefore described as "anisotropic".

Figure 13:
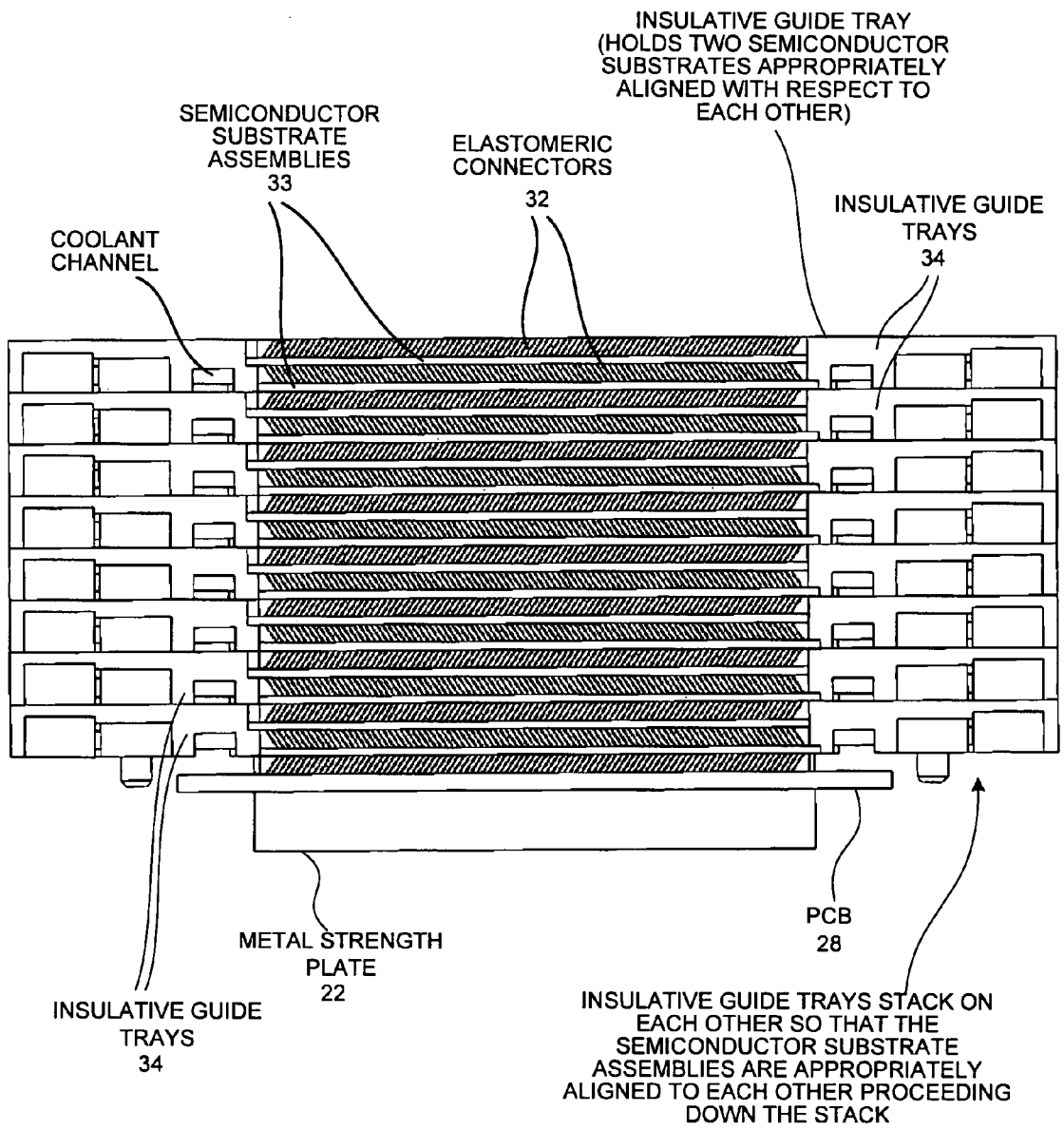
FIG. 13 is a cross-sectional side view of the semiconductor substrate stack assembly of FIG. 10.

FIG. 13 is a cross-sectional side view of the stack 27. The diagram shows how elastomeric connectors 32 are compressed between the semiconductor substrates 33 of the stack 27. In one example, the elastomeric connectors are MT-type anisotropic elastomeric connectors available from Shin-Etsu Polymer America Inc. The elastomeric connectors and semiconductor substrates, when disposed in the stack, form busses of many vertically extending parallel conductors. Many such vertically extending conductors extend vertically, in parallel, down the stack. Each conductor extends from the top semiconductor substrate assembly of the stack, vertically down through elastomeric connectors and semiconductor substrate assemblies of the stack, to the bottom semiconductor substrate assembly, and the bottom PCB 28. The elastomeric connectors and semiconductor substrate assemblies are retained by insulative guide trays 34. Insulative guide tray 48, identified in the figures that follow, is one of the insulative guide trays 34.

Figure 14:
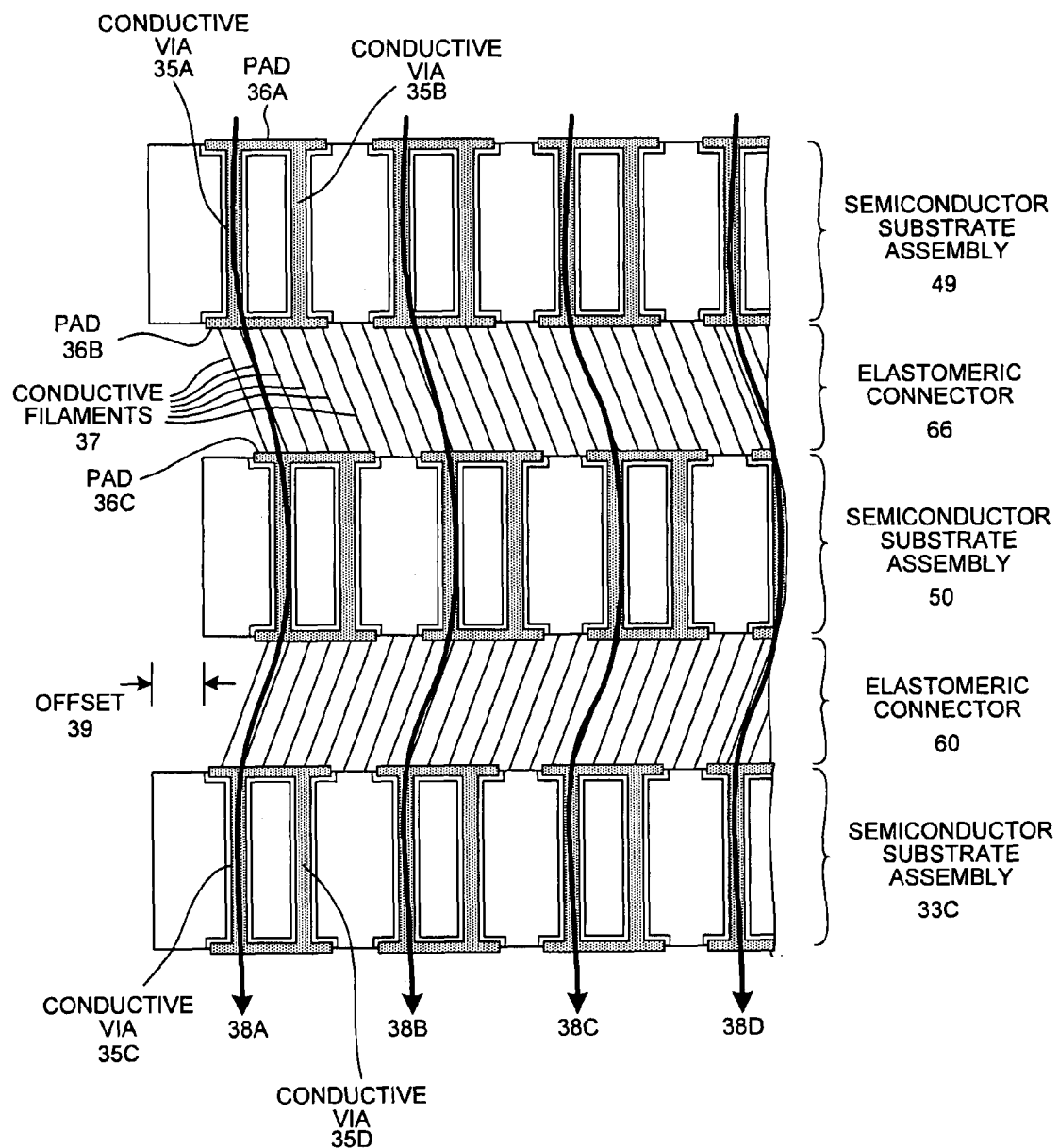
FIG. 14 is simplified cross-sectional side view that shows how many electrical connections extend in parallel down the stack of semiconductor substrates and elastomeric connectors.

FIG. 14 is a simplified cross-sectional view of a part of the stack 27 of FIG. 13. The insulative guide trays 34 are not shown in FIG. 14 in order to reveal other portions of the structure of the stack. Stack 27 includes a first semiconductor substrate assembly 49, a second semiconductor substrate assembly 50, and a third semiconductor substrate assembly 33C are pictured. The portions of the semiconductor substrate assemblies 49, 50 and 33C illustrated are the semiconductor substrate portions of the assemblies. Each semiconductor substrate is approximately five hundred to six hundred microns thick, and measures approximately 1.9 inches by 3.1 inches. Each semiconductor substrate includes a plurality of through-substrate conductive vias and associated pads. Reference numerals 35A and 35B identify two of the conductive vias. These two conductive vias, as well as two other conductive vias in a plane other than the plane of the illustration, have an associated horizontally oriented pad 36A on the upper surface of semiconductor substrate assembly 49, and also have an associated horizontally oriented pad 36B on the bottom surface of semiconductor substrate assembly 49. The conductive vias are approximately sixty microns in diameter and are spaced approximately two hundred microns apart, center to center. The conductive vias are electrically isolated from the material of the semiconductor substrate by a thin insulating layer that lines the holes in the substrate material. The pads 36A and 36B have a square shape, that is three hundred microns on a side, when viewed from a top-down perspective. The pads 36A and 36B are separated from one another by approximately one hundred microns.

A first elastomeric connector 66 is sandwiched and compressed between the bottom surface of first semiconductor substrate assembly 49 and the top surface of second semiconductor substrate assembly 50. A second elastomeric connector 60 is sandwiched and compressed between the bottom surface of second semiconductor substrate assembly 50 and the top surface of second semiconductor substrate assembly 33C. The elastomeric connectors include separate, inclined, parallel-extending, small-diameter conductive filaments that are disposed in a supporting insulative silicone rubber material. Each filament is approximately twenty microns in diameter. The filaments are spaced from each other at approximately fifty microns, center to center. The vertical height of the uncompressed elastomeric connector is approximately two millimeters, whereas the horizontal offset 39 is approximately one millimeter. Reference numeral 37 identifies six of the conductive filaments. These six conductive filaments couple pad 36B on the bottom surface of first semiconductor substrate assembly 49 to pad 36C on the upper surface of second semiconductor substrate assembly 50. The vertically extending conductors, that extend vertically in parallel down the stack, are identified in FIG. 14 by arrows 38A-38D.

Figure 15:
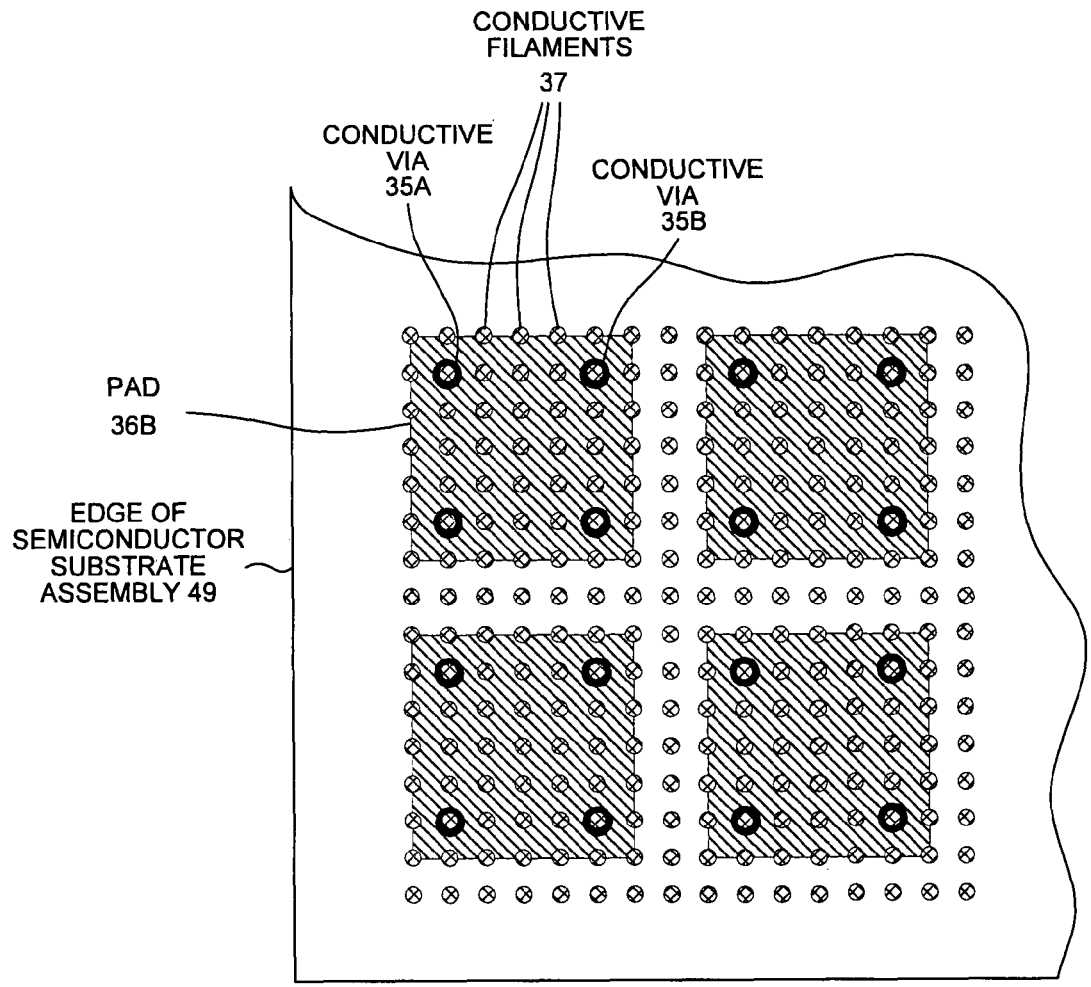
FIG. 15 is a diagram that illustrates how conductive filaments within an elastomeric connector line up with and engage pads on a semiconductor substrate assembly.

FIG. 15 is a top-down view of a portion of the bottom surface of first semiconductor substrate assembly 49 of FIG. 14. FIG. 15 shows how the conductive filaments of the elastomeric connector 66 match up with the pads on the bottom surface of the semiconductor substrate assembly 49. The offset 39 (see FIG. 14) with which the semiconductor substrates are staggered, one with respect to the next, accommodates the horizontal offset of filaments 37 due the inclination of the filaments in the elastomeric connector.

Figure 16:
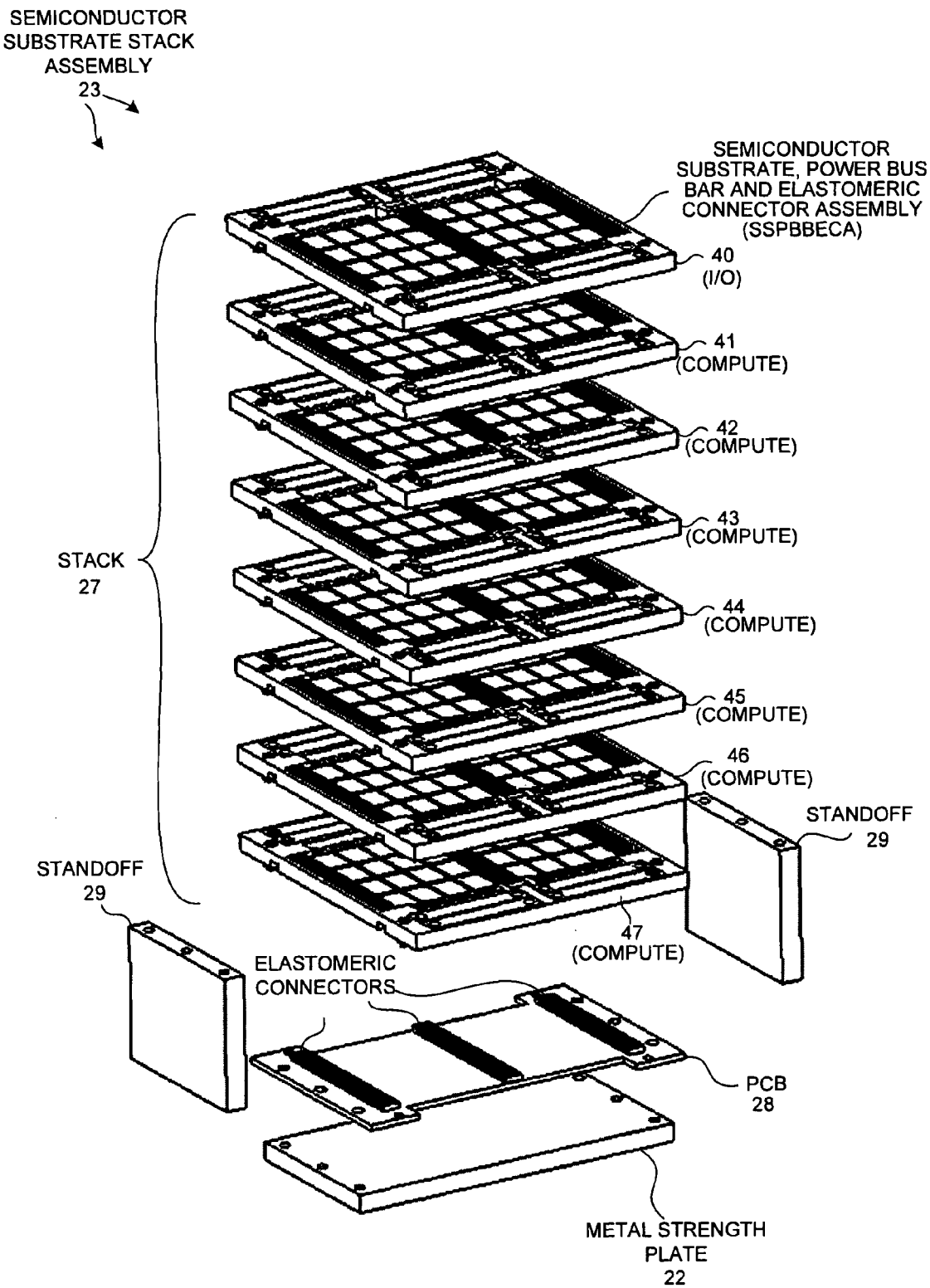
FIG. 16 is an exploded view of the semiconductor substrate stack assembly structure 23.

FIG. 16 is an exploded perspective view of the semiconductor substrate stack assembly 23 of FIGS. 4, 7 and 10. Stack 27 includes a stack of eight "semiconductor substrate, power bus bar and elastomeric connector assemblies" (SSPBBE-CAs) 40-47. There are seven "compute" SSPBBECAs 41-47, each involving one semiconductor substrate assembly having four FPGA dice and one semiconductor substrate assembly having memory dice. There is one "input/output" SSPBBECA 40 involving one semiconductor substrate assembly having four FPGA dice and one semiconductor substrate assembly having memory dice. The FPGA dice on the I/O SSPBBECA 40 are different FPGA dice that have additional high speed I/O circuitry and functionality.

Figure 17:
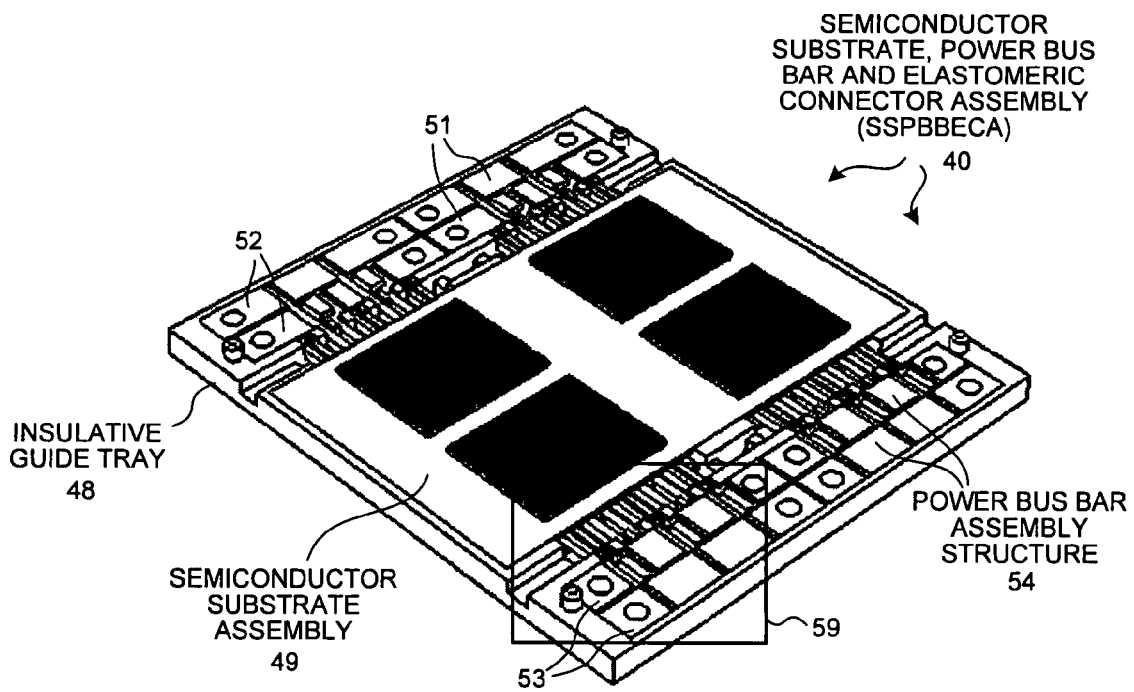
FIG. 17 is a perspective view of the top of the SSPBBECA 40 of FIG. 16.

FIG. 17 is a perspective view of the top of semiconductor substrate power bus bar and elastomeric connector assembly (SSPBBECA) 40. SSPBBECA 40 involves an insulative guide tray 48 that holds a pair of semiconductor substrate assemblies 49 and 50 (50 is not seen in the view of FIG. 17; see FIG. 19), a set of four power bus bar assembly structures 51-54, and two sets of three elastomeric connectors each (the elastomeric connectors are not seen in the view of FIG. 17). One set of three strip-shaped elastomeric connectors is sandwiched between the two semiconductor substrate assemblies 49 and 50. The other set of three strip-shaped elastomeric connectors is provided to couple this SSPBBECA 40 to another SSPBBECA below it in the stack.

In one example, insulative guide tray 48 is an injection molded plastic part. Insulative guide trays can be made that are identical to each other except that they hold their respective semiconductor substrate assemblies in different lateral relationships in the stack. By employing different insulative guide trays having the appropriate offsets, different types of semiconductor substrate assemblies (FPGA, I/O, memory) can stacked in any desired order while still providing proper continuity of the vertical bus conductors that extend in parallel from the top to the bottom of the stack through anisotropic elastomeric connectors and semiconductor substrates. Registration of the pads on the semiconductor substrates that make contact with the conductive filaments within the elastomeric connectors is identical regardless of whether the semiconductor substrate assembly is an FPGA semiconductor substrate assembly, a memory semiconductor substrate assembly, or an I/O semiconductor substrate assembly.

Figure 18:
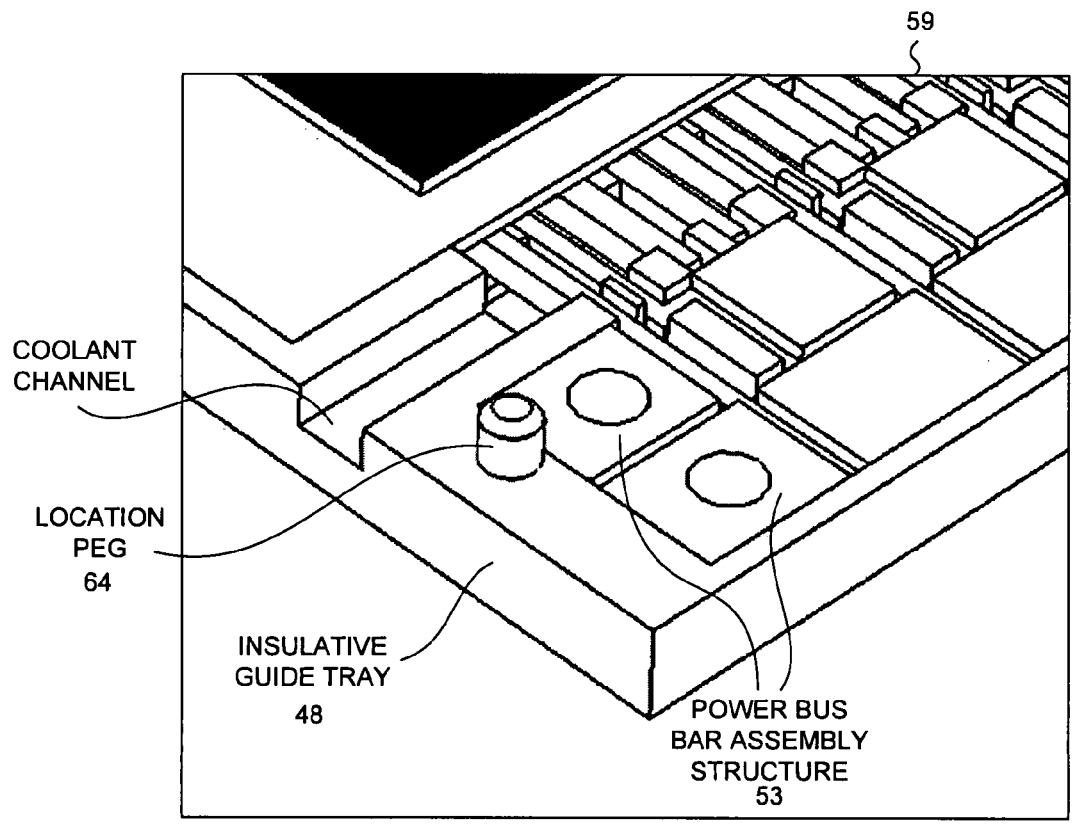
FIG. 18 is an expanded view of a part of FIG. 17.

FIG. 18 is a more detailed view of a portion 59 of the top of SSPBBECA 40 of FIG. 17.

Figure 19:
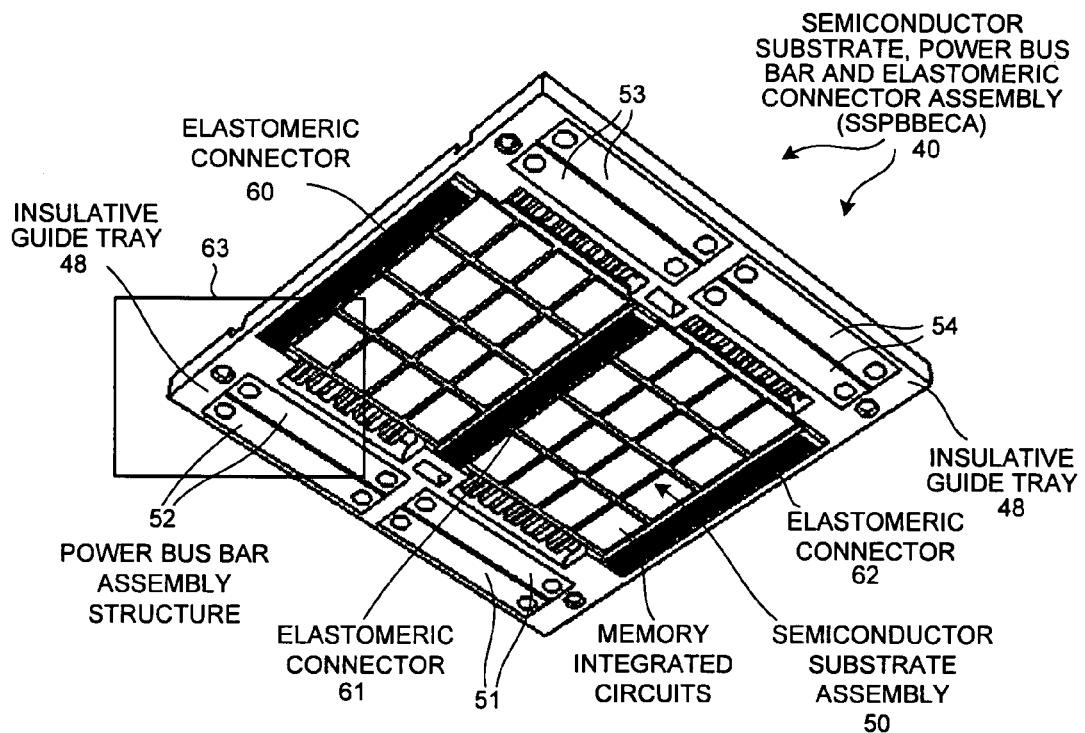
FIG. 19 is a perspective view of the bottom of the SSPBBECA 40 of FIG. 17.

FIG. 19 is a perspective view of the bottom of SSPBBECA 40 of FIG. 17. The bottom sides of the power bus bar assemblies 51-54 are seen. The three elastomeric connectors 60-62 that couples SSPBBECA 40 to the SSPBBECA below it in the stack are seen extending down from the bottom surface of insulative guide tray 48.

Figure 20:
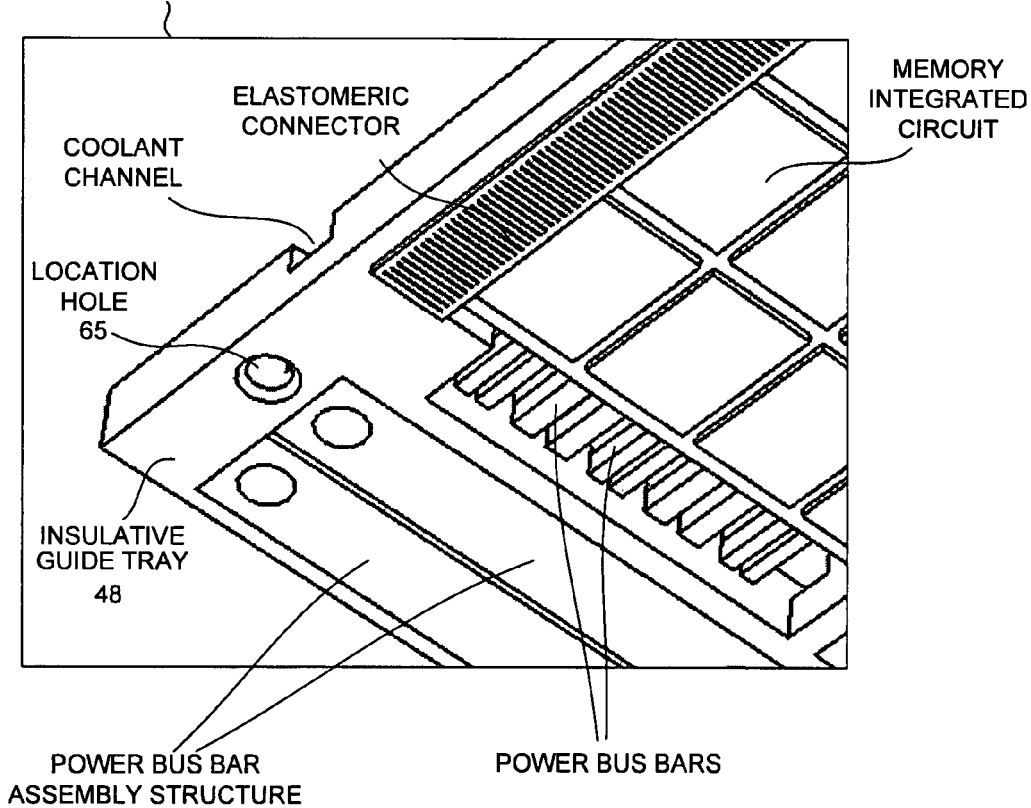
FIG. 20 is an expanded view of a part of FIG. 19.

FIG. 20 is an expanded view of a part 63 of the bottom of the SSPBBECA 40 of FIG. 19. Note the location peg 64 in the top of the SSPBBECA 40 in FIG. 18 and the associated location hole 65 in the bottom of SSPBBECA 40 in FIG. 20. A location peg in one SSPBBECA engages a location hole in another SSPBBECA located above in the stack. The location peg and the engaging location hole are alignment features that maintain the insulative guide trays of the stack in proper alignment when the stack is being assembled and then compressed together. The semiconductor substrate assembly 49 of FIG. 17 includes FPGA dice that are die-bonded directly to the semiconductor substrate, whereas the semiconductor substrate assembly 50 of FIG. 19 includes memory dice that are die-bonded directly to the semiconductor substrate.

Figure 21:
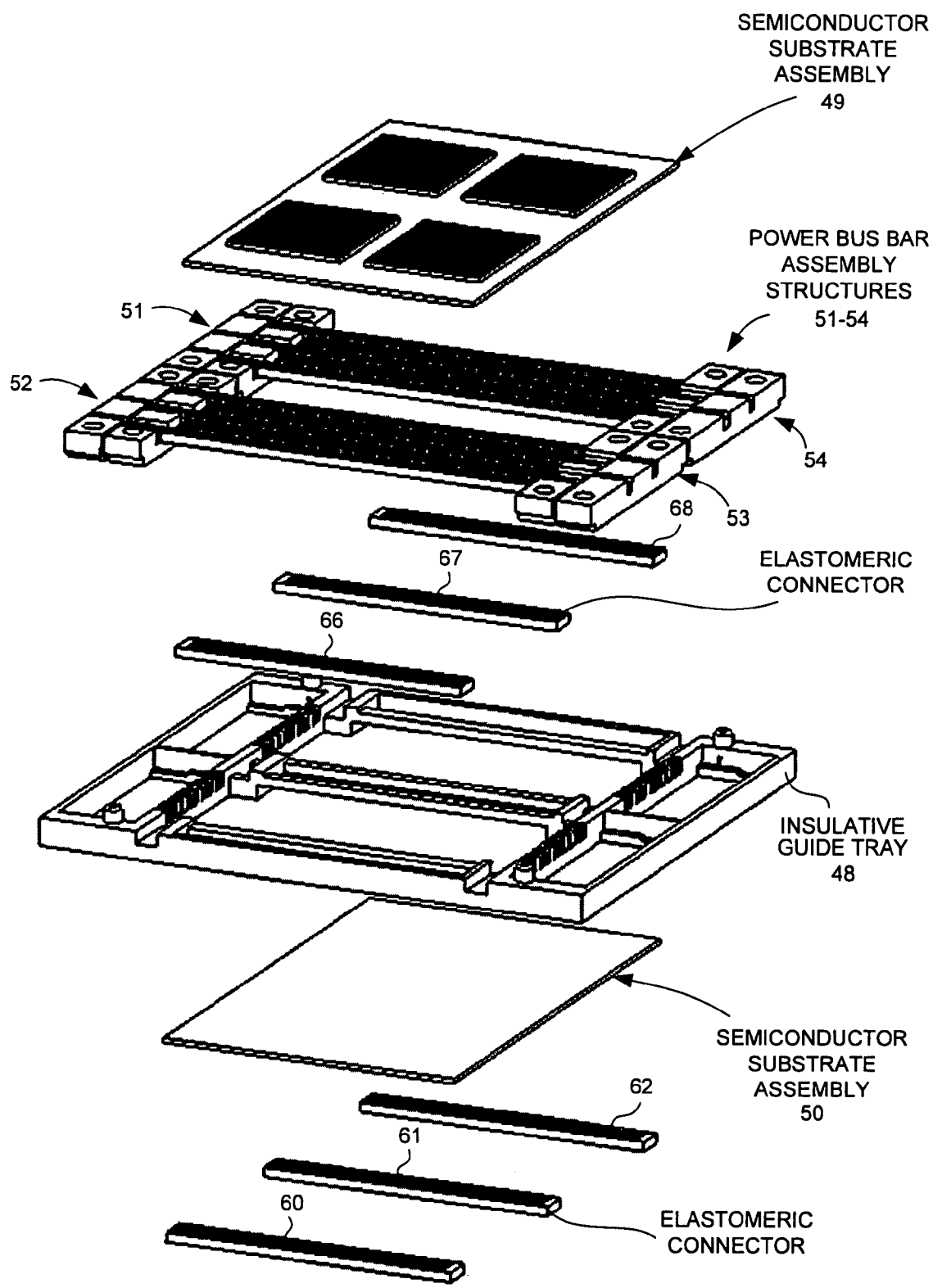
FIG. 21 is an exploded view that shows how various parts of SSPBBECA 40 fit together.

FIG. 21 is an exploded view of the SSPBBECA 40 of FIGS. 17-20. The set of three elastomeric connectors 66-68 that couple the FPGA semiconductor substrate assembly 49 to the underlying memory semiconductor substrate assembly 50 are illustrated. The memory dice are die-bonded to the bottom side of the semiconductor substrate of assembly 50, and therefore are not seen in the view of FIG. 21.

Figure 22:
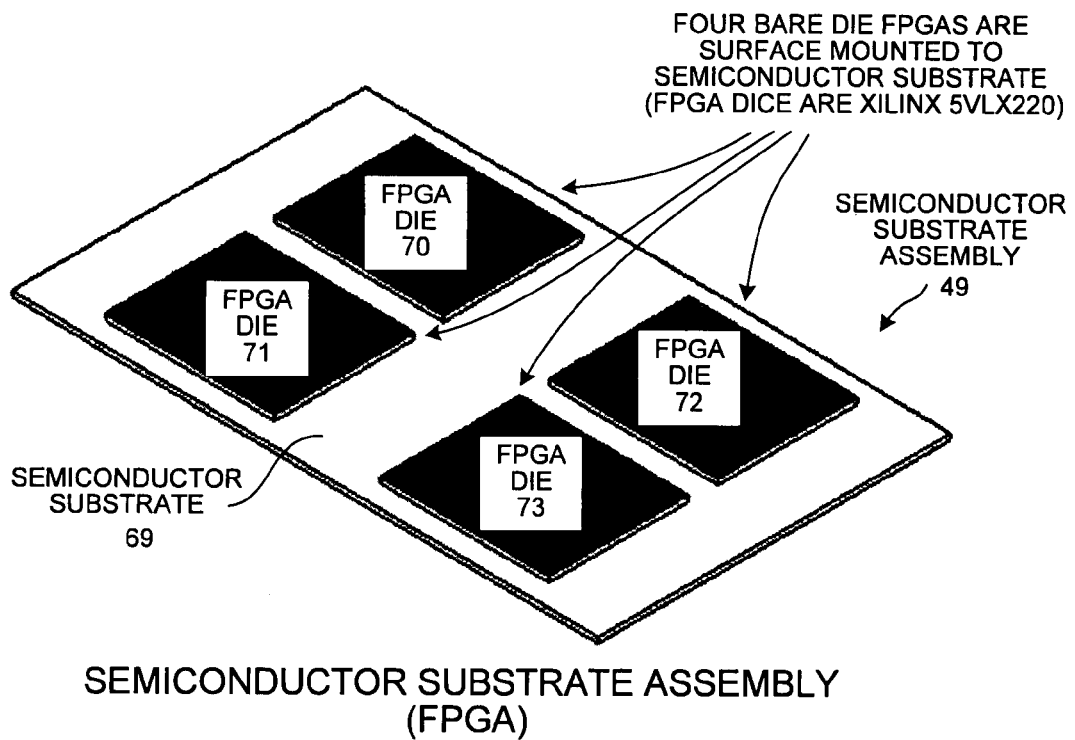
FIG. 22 is a perspective view of the top of semiconductor substrate assembly 49 of the SSPBBECA 40 of FIG. 21.

FIG. 22 is a perspective view of the top of semiconductor substrate assembly 49. Semiconductor substrate assembly 49 includes semiconductor substrate 69 and four FPGA dice 70-73.

Figure 23:
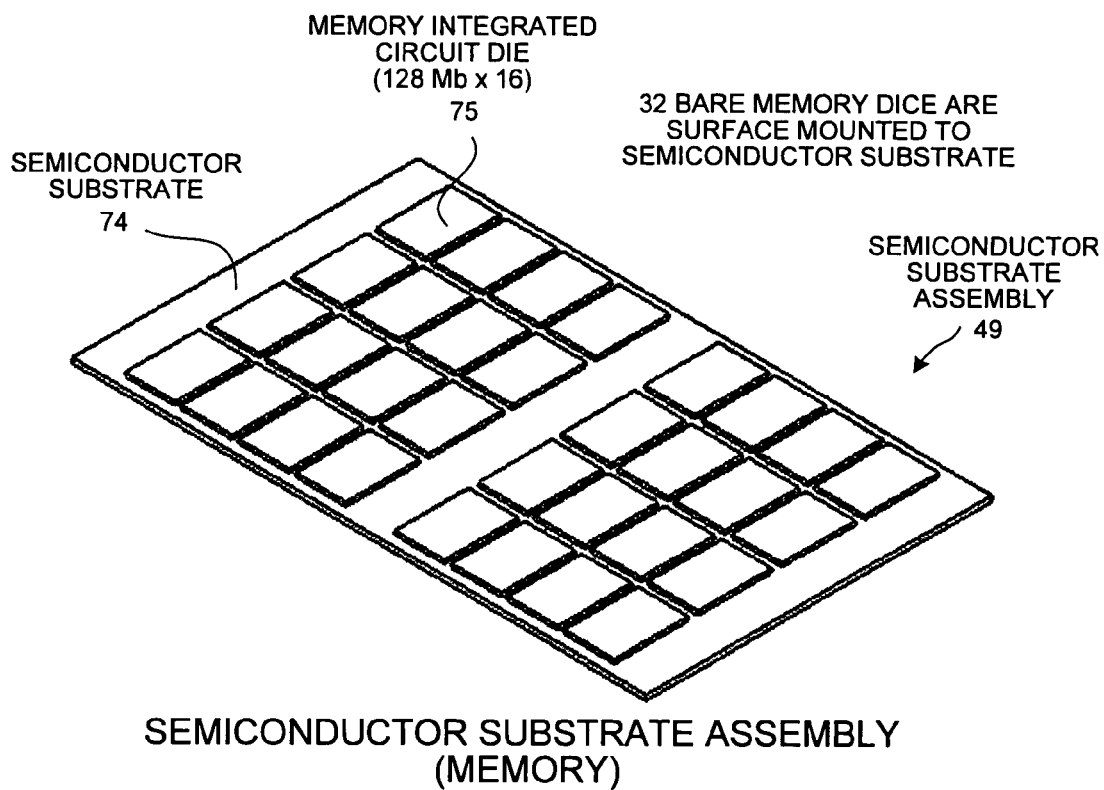
FIG. 23 is a perspective view of the bottom of semiconductor substrate assembly 50 of the SSPBBECA 40 of FIG. 21.

FIG. 23 is a perspective view of semiconductor substrate assembly 50. Semiconductor substrate assembly 50 includes semiconductor substrate 74 and thirty-two bare memory dice that are surface-mounted directly to semiconductor substrate 74. Memory die 75 is a representative one of these memory dice.

Figure 24:
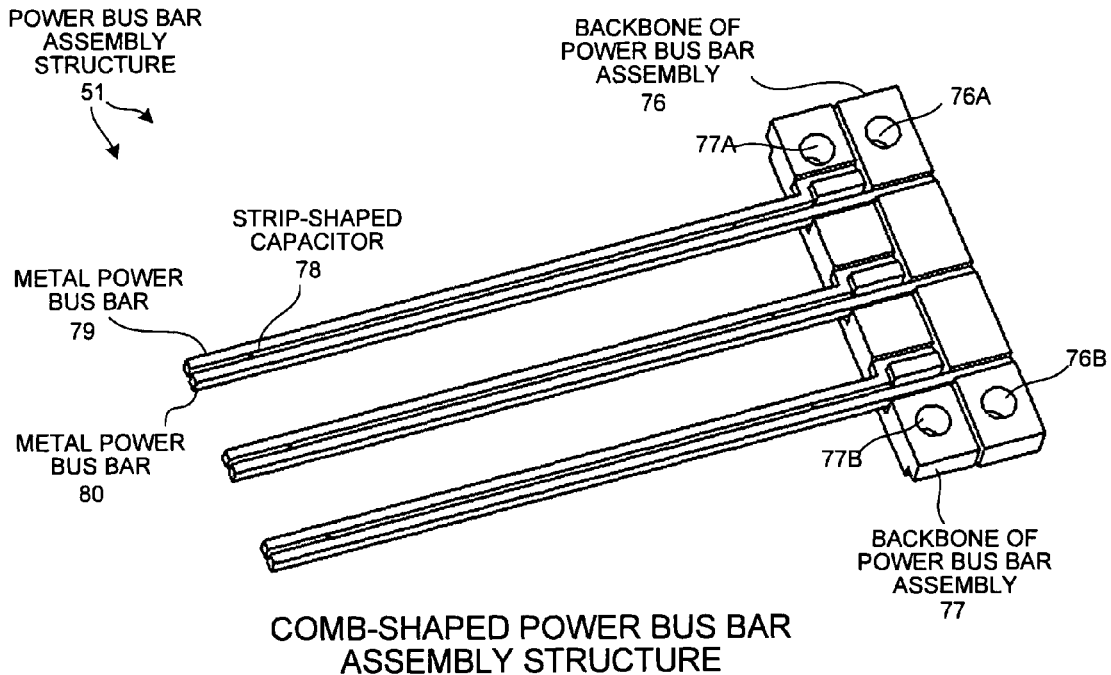
FIG. 24 is a perspective view of power bus bar assembly structure 51 of SSPBBECA 40.

FIG. 24 is a perspective view of power bus bar assembly structure 51 of SSPBBECA 40 of FIG. 17. Power bus bar assembly structure 51 actually includes two comb-shaped power bus bar assemblies 76 and 77. Each of these two power bus bar assemblies is made of solid copper. Each of these two power bus bar assemblies has a comb-shaped structure with a backbone portion, and parallel extending fingers or tines that extend from the backbone portion. The fingers or tines are press fit into the backbone portion. Note that in the illustration of power bus bar assembly structure 51 of FIG. 24, two comb-shaped power bus bar assemblies 76 and 77 are pictured. Strip-shaped capacitors are disposed between corresponding pairs of fingers of the two power bus bar assemblies. For example, strip-shaped capacitor 78 is disposed between power bus bar 79 and power bus bar 80. The backbone portions of the two power bus bar assemblies illustrated in FIG. 24 are not physically contacting one another, rather there is a small gap between the two backbones so that a power supply voltage may be present between the two power bus bar assemblies 76 and 77. Four holes 76a, 76B, 77A and 77B extend through the backbone portions of the power bus bar assemblies 76 and 77 as illustrated. It is through these holes that long bolts 20 (see the exploded view of FIG. 4) extend. The long bolts 20 extend through holes in the power bus bars of the stack and engage threads in the metal standoffs 26 (see FIG. 4). When the long bolts are tightened, they pull the standoffs 26 toward strength plate 17 (see FIG. 4), thereby compressing the semiconductor substrate stack assembly 23. The backbone portion of a power bus bar assembly is compressed against, and therefore makes electrical contact with, a backbone portion of a corresponding power bus bar assembly either below and/or above it in the stack.

Figure 25:
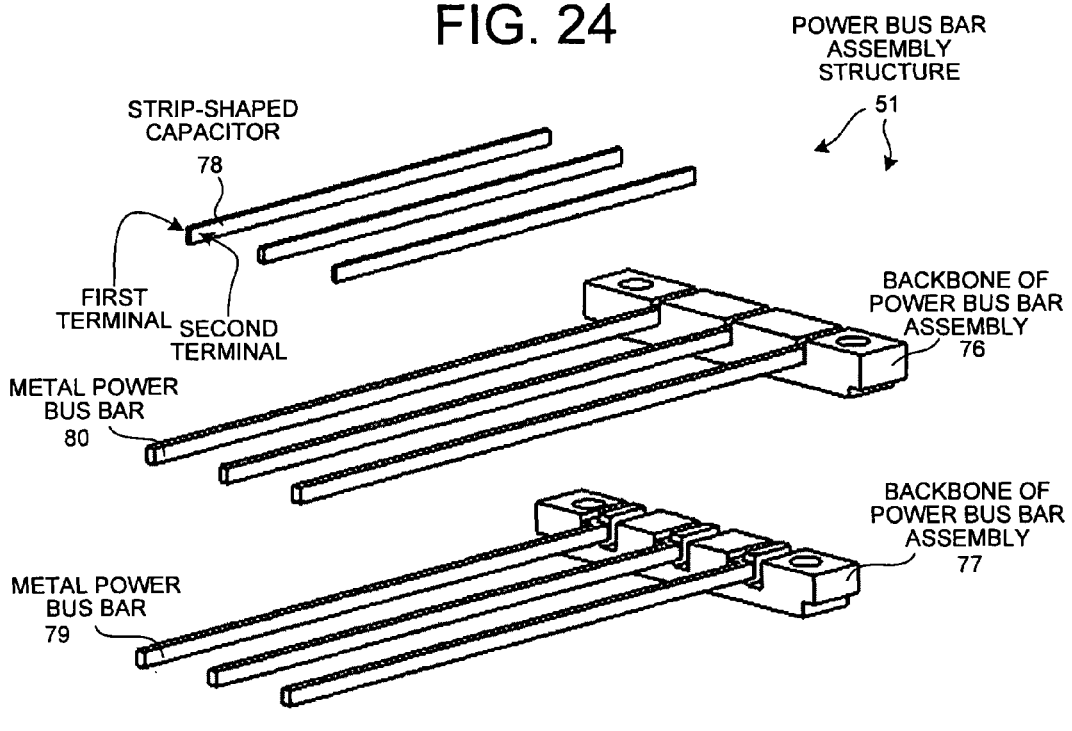
FIG. 25 is an exploded view that shows how the various parts of the power bus bar assembly structure 51 fit together.

FIG. 25 is an exploded view of the power bus bar assembly structure 51 of FIG. 22.

Figure 26:
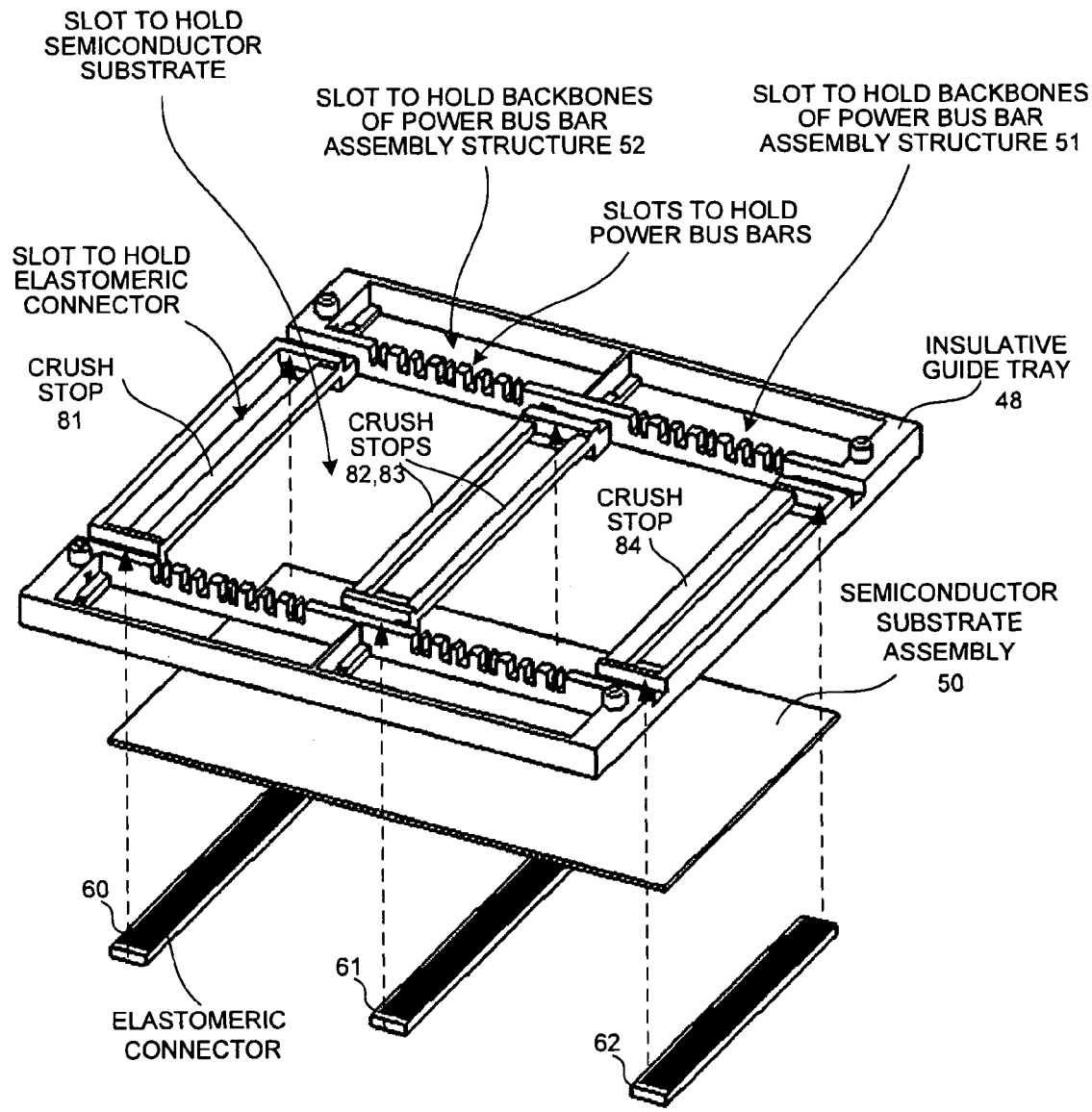
FIG. 26 is a perspective view that shows the insulative guide tray of the SSPBBECA 40.

FIG. 26 is an exploded view of SSPBBECA 40 of FIG. 17 showing the insulative guide tray 48 in further detail. The upper FPGA semiconductor substrate assembly 49 and the elastomeric connectors 66-68 that are disposed between the two semiconductor substrate assemblies of the SSPBBECA are not illustrated in order to show the memory semiconductor substrate assembly 50 in a less obscured fashion. Insulative guide tray 48 has crush stop portions 81-84 that prevent each of the elastomeric connectors 66-68 from compressing more than a desired and limited amount. In the example of FIG. 26, when elastomeric connectors 66-68 have compressed their maximum amounts between semiconductor substrate assemblies 49 and 50, the crush stops 81-84 make contact with the bottom surface of semiconductor substrate assembly 49 and the top surface of semiconductor substrate assembly 50, thereby helping prevent further compression of the elastomeric connectors 66-68. Power bus bars also help prevent this further compression.

Similarly, insulative guide tray 48 serves as a crush stop to prevent each of the elastomeric connectors 60-62 from compressing more than a desired and limited amount. When elastomeric connectors 60-62 are in their uncompressed condition, their bottom surfaces extend below the plane of the bottom of the insulative guide tray 48 when the structure is considered from the perspective of FIG. 26. The top surfaces of the elastomeric connectors contact the bottom surface of the semiconductor substrate assembly 50. As the elastomeric connectors 60-62 compress, their bottom surfaces move up toward the bottom surface of the insulative guide tray 48 until the bottom surfaces of the elastomeric connectors and the bottom surface of the insulative guide tray are flush. Further compression of the elastomeric connectors 60-62 is prevented because the semiconductor substrate assembly below the elastomeric connectors 60-62 is held by another insulative guide tray below, and the upward movement of this other insulative guide tray is stopped due to contact between the upper surface of this other insulative guide tray and the bottom surface of the insulative guide tray illustrated in FIG. 26. The side edges that provide the vertical thickness of the insulative guide tray is therefore also considered a crush stop. When the stack 27 is in its compressed state, the various insulative guides trays of the stack contact one another as illustrated in FIG. 13.

In addition to crush stops, the insulative guide tray 48 has slots to hold the elastomeric connectors, slots to hold the backbone portions of the power bus bar assemblies, slots to hold the semiconductor substrate assemblies, and slots to hold the power bus bar fingers in place during assembly of stack 27.

Figure 27:
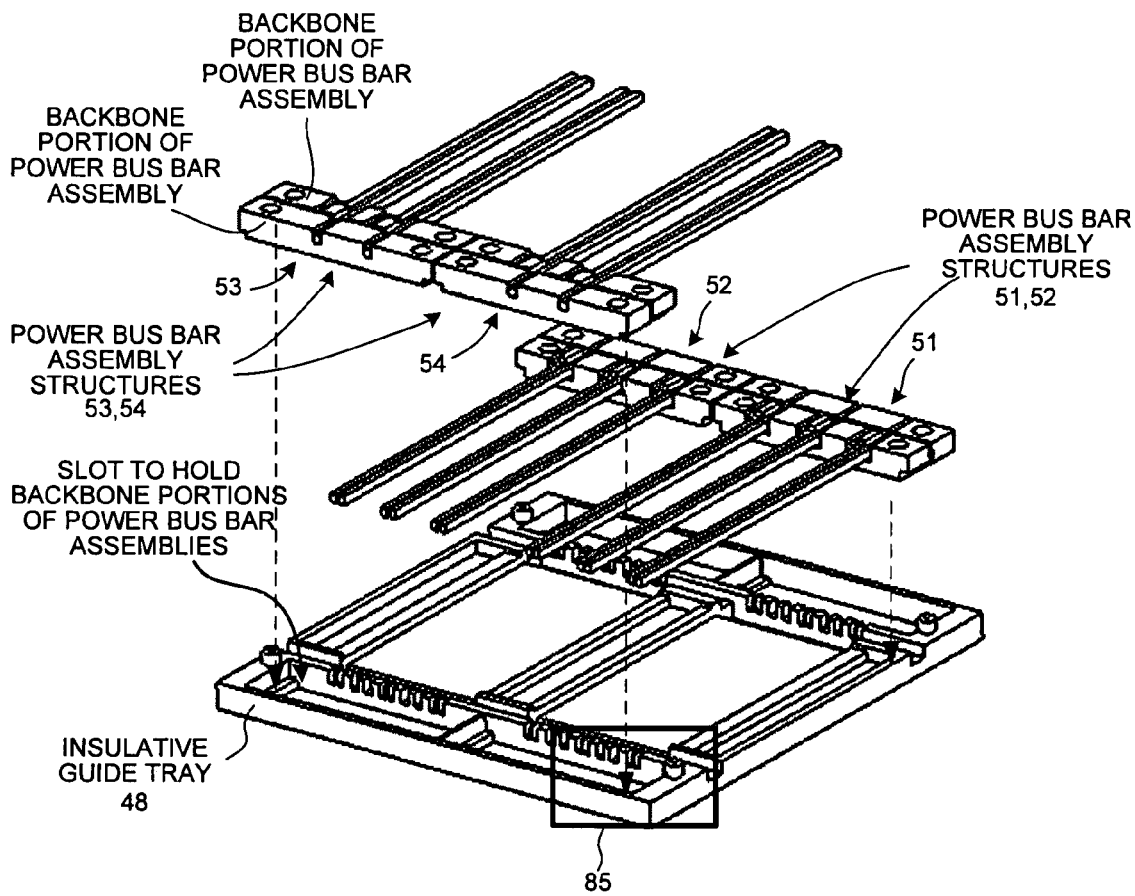
FIG. 27 is a perspective view that illustrates how the power bus bar assembly structures fit into the insulative guide tray of FIG. 26.

FIG. 27 is a perspective diagram that illustrates how the four power bus bar assembly structures 51-54 fit into the insulative guide tray 48. The tines of opposing pairs of comb-shaped power bus bar assembly structures are interdigitated where the tines extend between semiconductor substrate assemblies 49 and 50.

Figure 28:
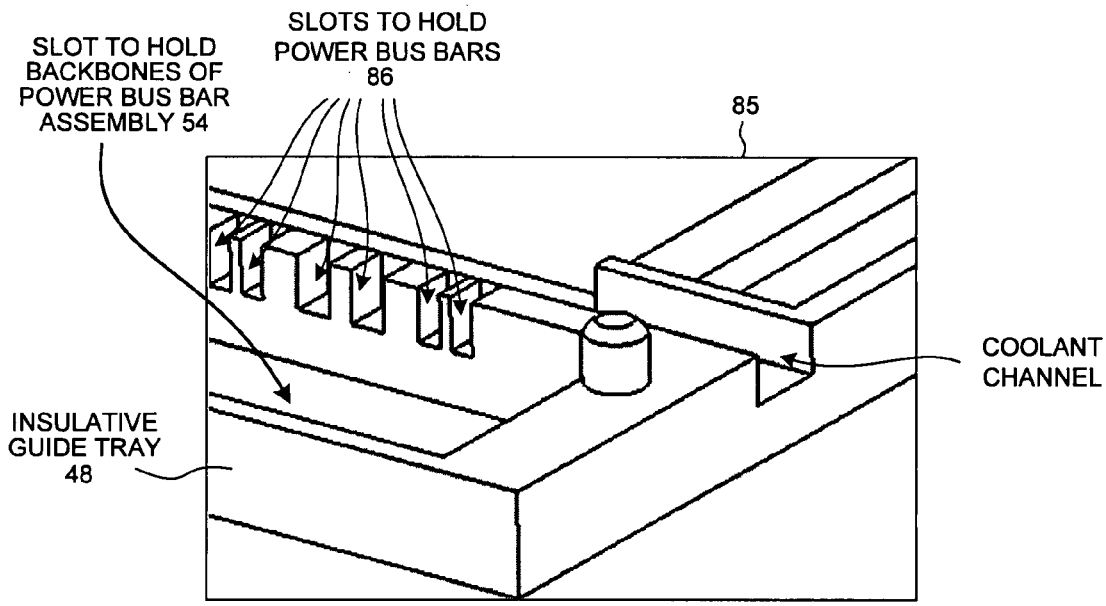
FIG. 28 is an expanded view of a part of FIG. 27.

FIG. 28 is an expanded view of portion 85 of FIG. 27. Slots 86 hold the power bus bars in place. Note that when the stack is assembled, the backbone portions of corresponding ones of the power bus bar assemblies stack on top of one another, so that a low resistance electrical connection exists through the heavy metal of each stack of backbone portions. FIG. 3 illustrates the stack enclosure assembly 3 without the insulative guide trays. Note that the backbone portions are arranged in stacks. Each backbone portion has a rectangular cross-section. Four such stacks are seen in cross-section in FIG. 3. A DC supply voltage is present between the upper two stacks of backbone portions in FIG. 3. Tines or fingers of the comb-shaped bus bar assembly structures supply this DC supply voltage down into the stack of semiconductor substrate assemblies. Also, a DC supply voltage is present between the lower two stacks of backbone portions in FIG. 3. Tines or fingers of the comb-shaped bus bar assembly structures supply this DC supply voltage up into the stack of semiconductor substrate assemblies. The tines of opposing comb-shaped power bus bar assembly structures interleave with one another in an interdigitated fashion.

Figure 29:
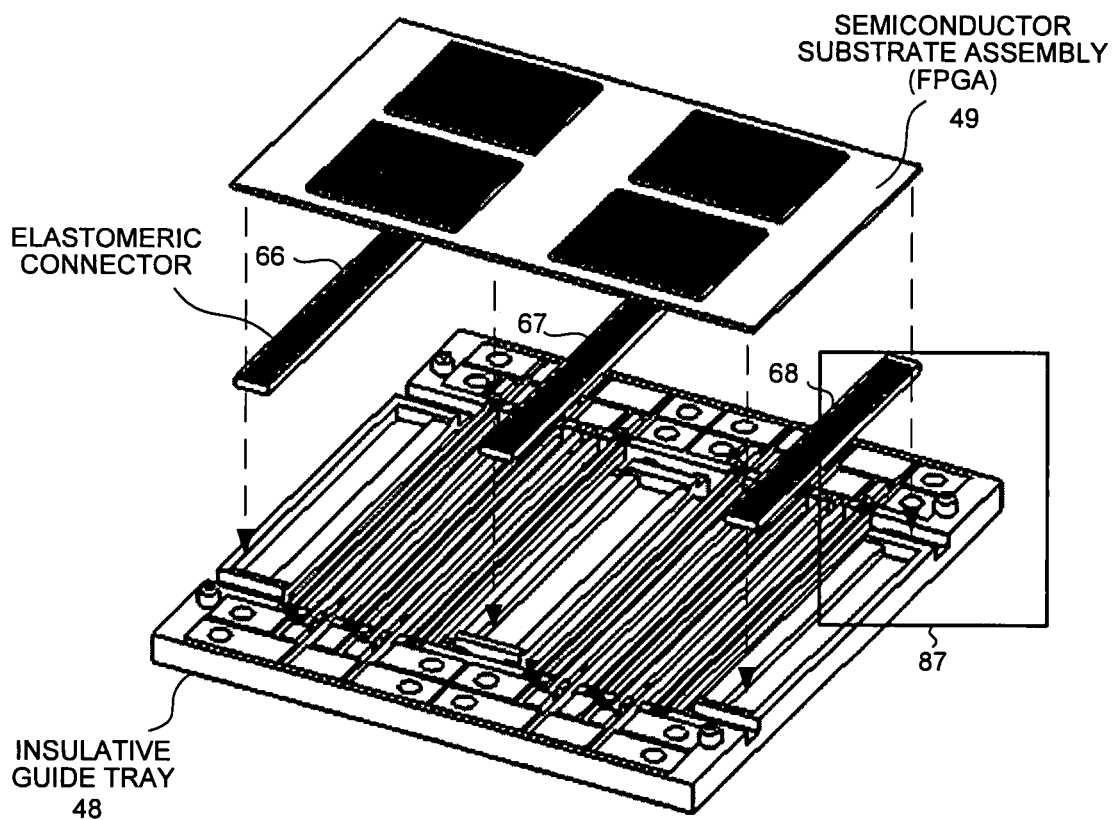
FIG. 29 is an exploded perspective view that shows how the semiconductor substrate assembly 49 and elastomeric connectors 66-68 fit into the insulative guide tray 48.

FIG. 29 is perspective diagram showing the structure of FIG. 26, with indications of how the elastomeric connectors 66-68 and the upper semiconductor substrate assembly 49 fit down into the insulative guide tray 48. The elastomeric connectors 60-62 and the lower semiconductor substrate assembly 50 are already installed in the insulative guide tray 48.

Figure 30:
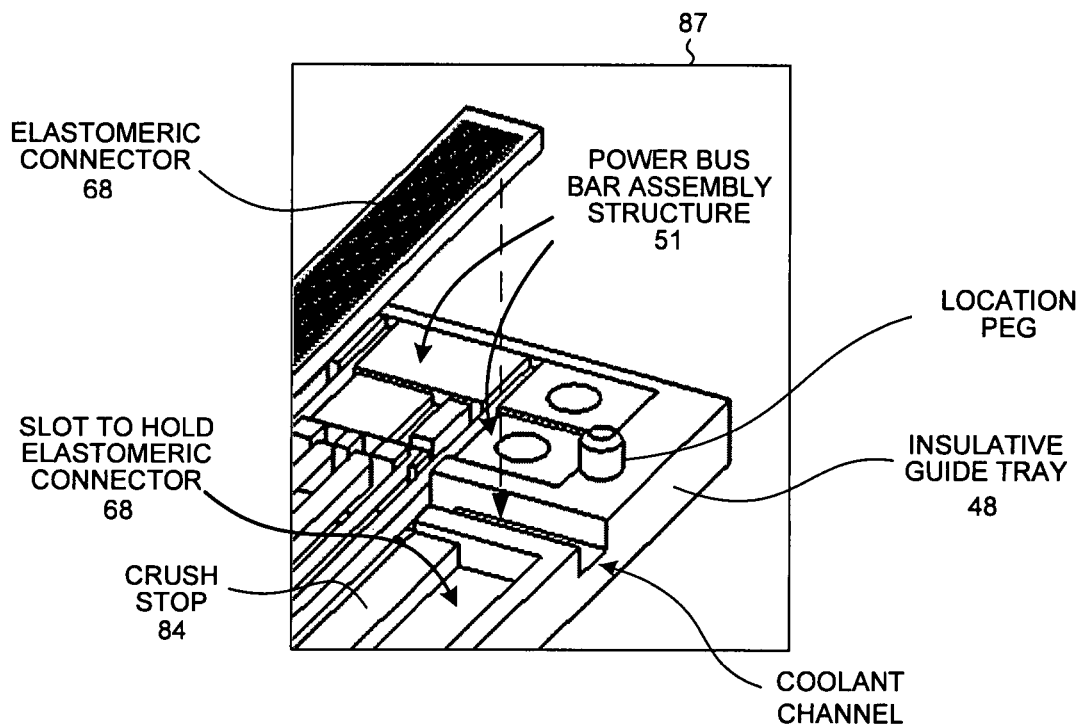
FIG. 30 is an expanded view of a part of FIG. 29.

FIG. 30 is an expanded view of a portion 87 of FIG. 29.

Figure 31:
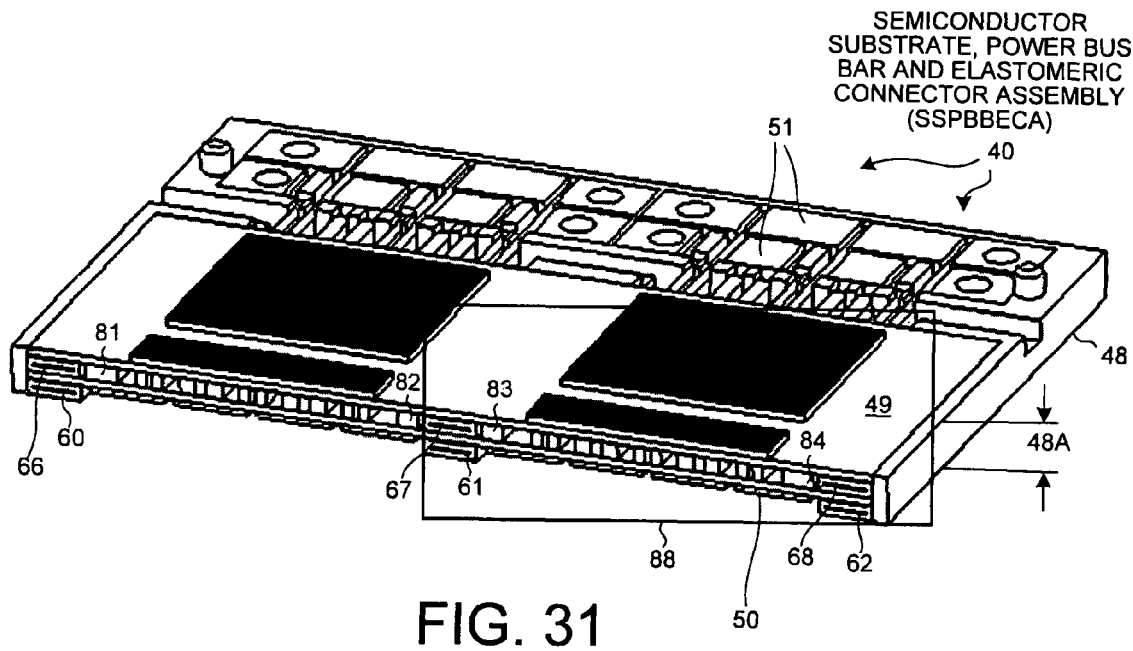
FIG. 31 is a cross-sectional perspective view of SSPBBECA 40.

FIG. 31 is a cross-sectional diagram of SSPBBECA 40 of FIG. 17. The combined two semiconductor substrates of the two semiconductor substrate assemblies 49 and 50 and the two elastomeric connectors 68 and 62, taken in the vertical dimension of FIG. 31, cannot compress more than the thickness 48A of the insulative guide tray 48.

Figure 32:
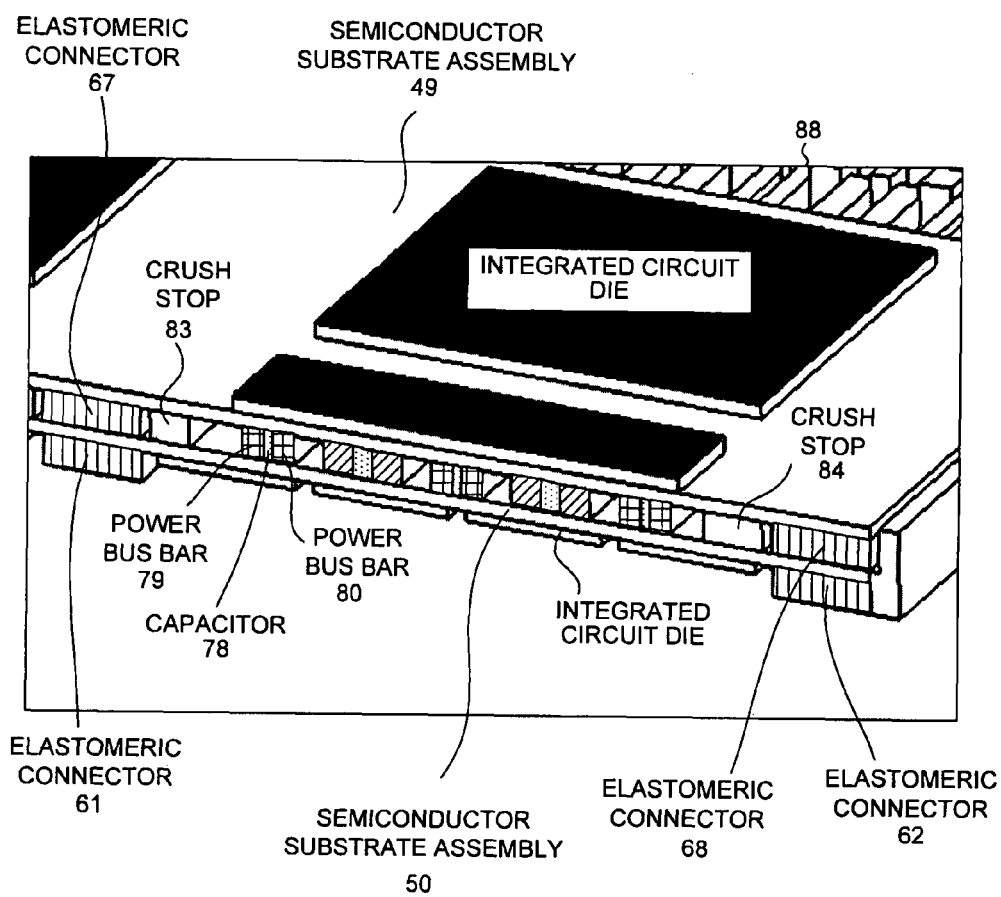
FIG. 32 is an expanded view of a part of FIG. 31.

FIG. 32 is an expanded view of a portion 88 of FIG. 31. In FIG. 24, two power bus bars 79 and 80 of power bus bar assembly structure 51 are identified. In FIG. 27, how the power bus bar assembly structure 51 is disposed in insulative tray 48 is illustrated. In FIG. 32, the ends of the power bus bars 79 and 80 are seen, along with the end of the intervening capacitor 78. In the cross-sectional view of FIG. 30, three of the pairs of power bus bars are of power bus bar assembly structure 51 (see FIG. 27) and the other two of the pairs of power bus bars are of power bus bar assembly structure 54 (see FIG. 27).

Figure 33:
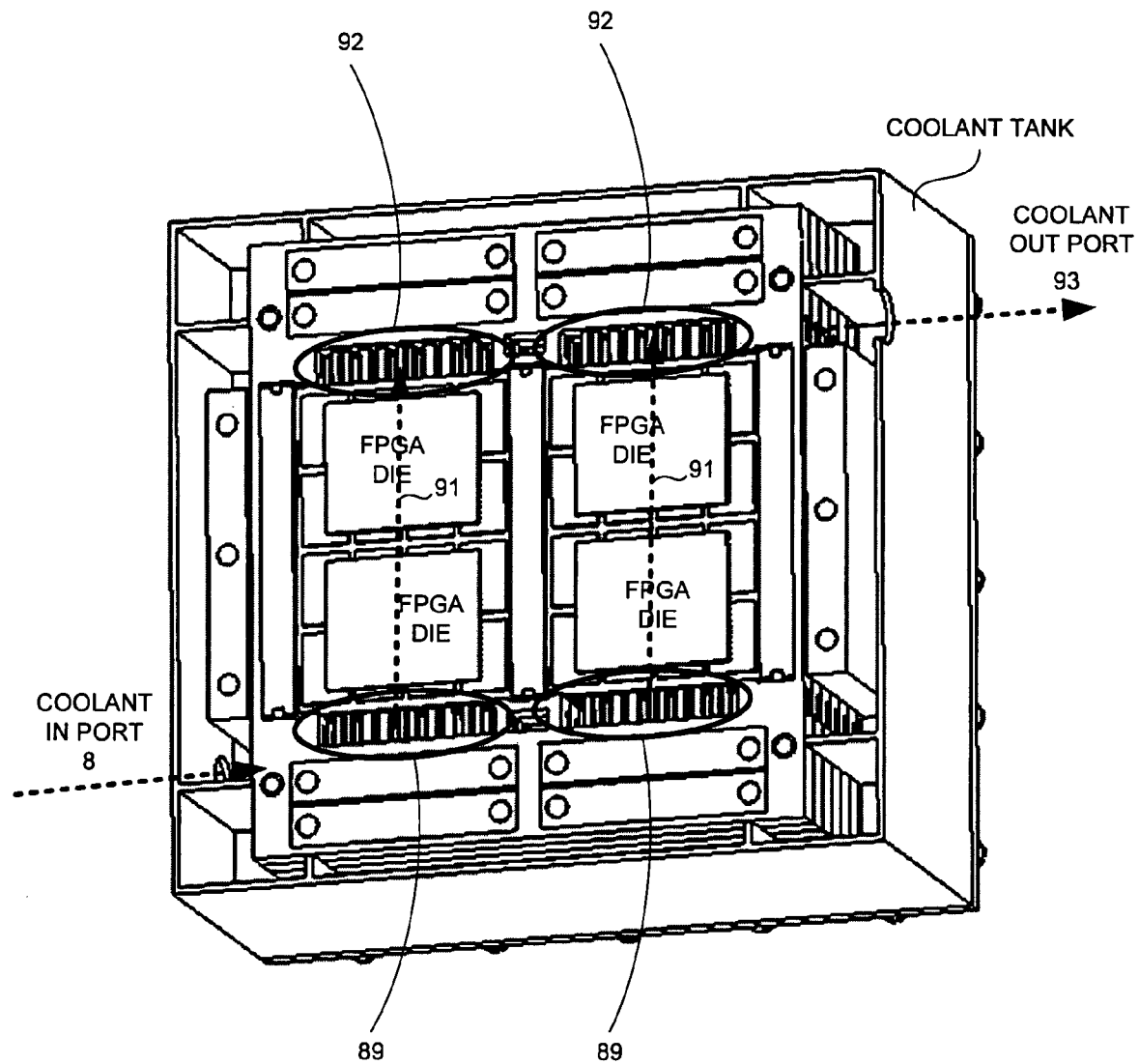
FIG. 33 is a schematic view illustrating how liquid coolant flows across the SSPBBECAs and through the semiconductor substrate stack.

FIG. 33 is a perspective diagram illustrating how liquid coolant flows within the semiconductor substrate stack. The coolant flows into the coolant in port 8, and then flows up through the stack in a direction perpendicular to the direction that the power bus bars extend. This direction of flow is a flow into the plane of the page in the illustration of FIG. 31. The flow passes through the rectangular areas identified by reference numerals 89 in FIG. 33. Bus bars appears as vertical bars that extend through these rectangular areas 89. Heavy arrows 90 in FIG. 7 show this flow of coolant. Coolant flows between portions of the fingers of the power bus bars as seen in FIG. 7. The coolant flows up along one side (for example, the bottom side of the stack in the view of FIG. 33) of the stack in this way in the direction of arrows 90 of FIG. 7, then flows in a perpendicular direction across the semiconductor substrates (between the two semiconductor substrates of each SSPBBECA). FIG. 33 illustrates this flow with vertical dashed arrows 91. Some of this flow flows through channels that are bounded on two opposite sides by semiconductor substrates and that are bounded on two other opposite sides by power bus bars. The power bus bars therefore serve as guides for the flow of coolant. Once on the other side of the stack (for example, the top side of the stack in the view of FIG. 33), the coolant liquid flows in a perpendicular direction up (up in the direction of arrows 90 in FIG. 7) through other rectangular areas 92 (see FIG. 33). Once at the top of the stack, the coolant flows out of a coolant out port 93. Care is taken to ensure that rectangular areas 89 and 92 are large enough to allow enough liquid coolant circulation to cool the stack. Although coolant liquid is described as flowing between bus bars between the two semiconductor substrates of each SSPBBECA, the coolant liquid also flows across the stack in other available and open volumes. For example, coolant flows across the surfaces of the FPGA and memory integrated circuit dice.

Figure 34A:
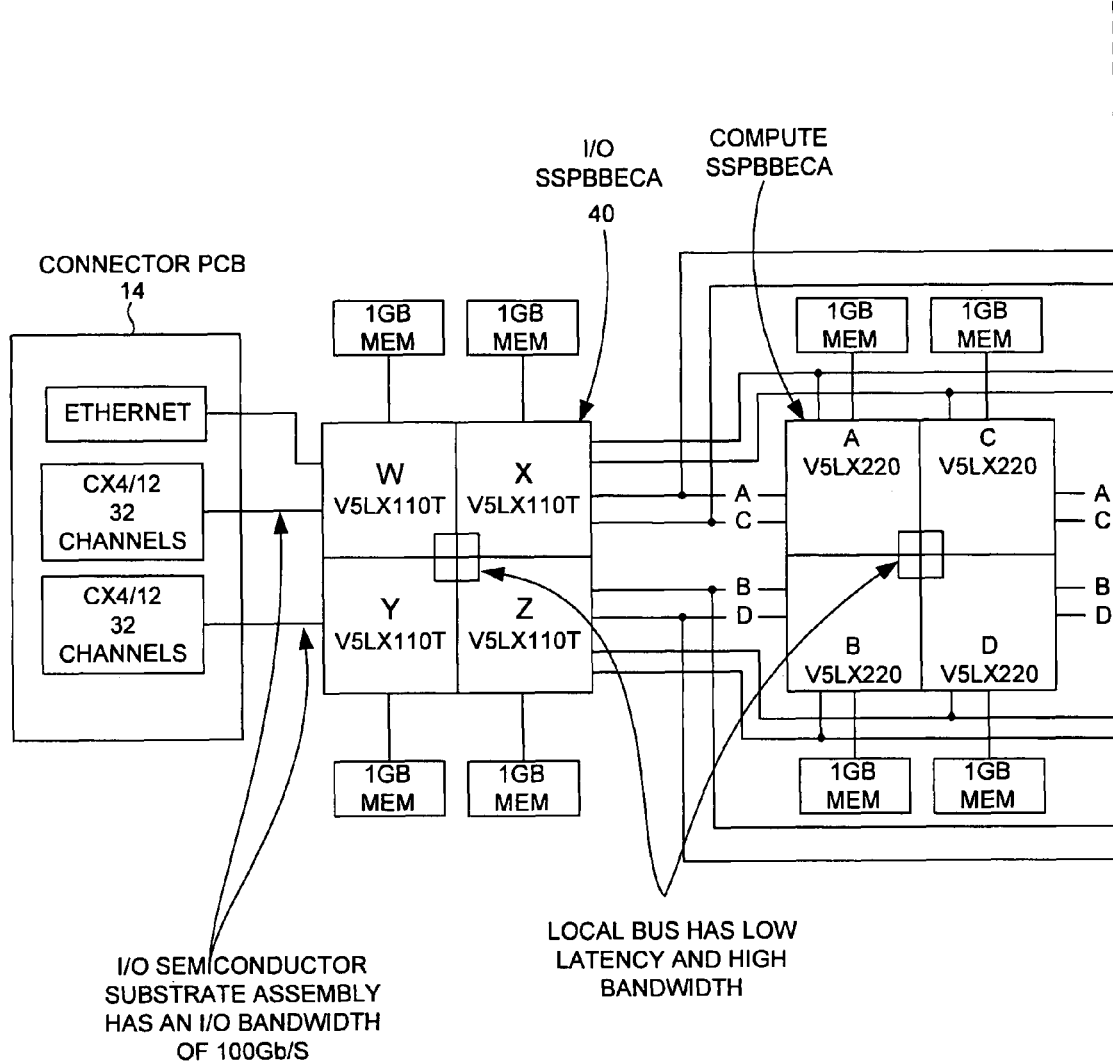
FIG. 34 is a circuit block diagram of the semiconductor substrate stack. The stack involves eight SSPBBECAs.
Figure 34B:
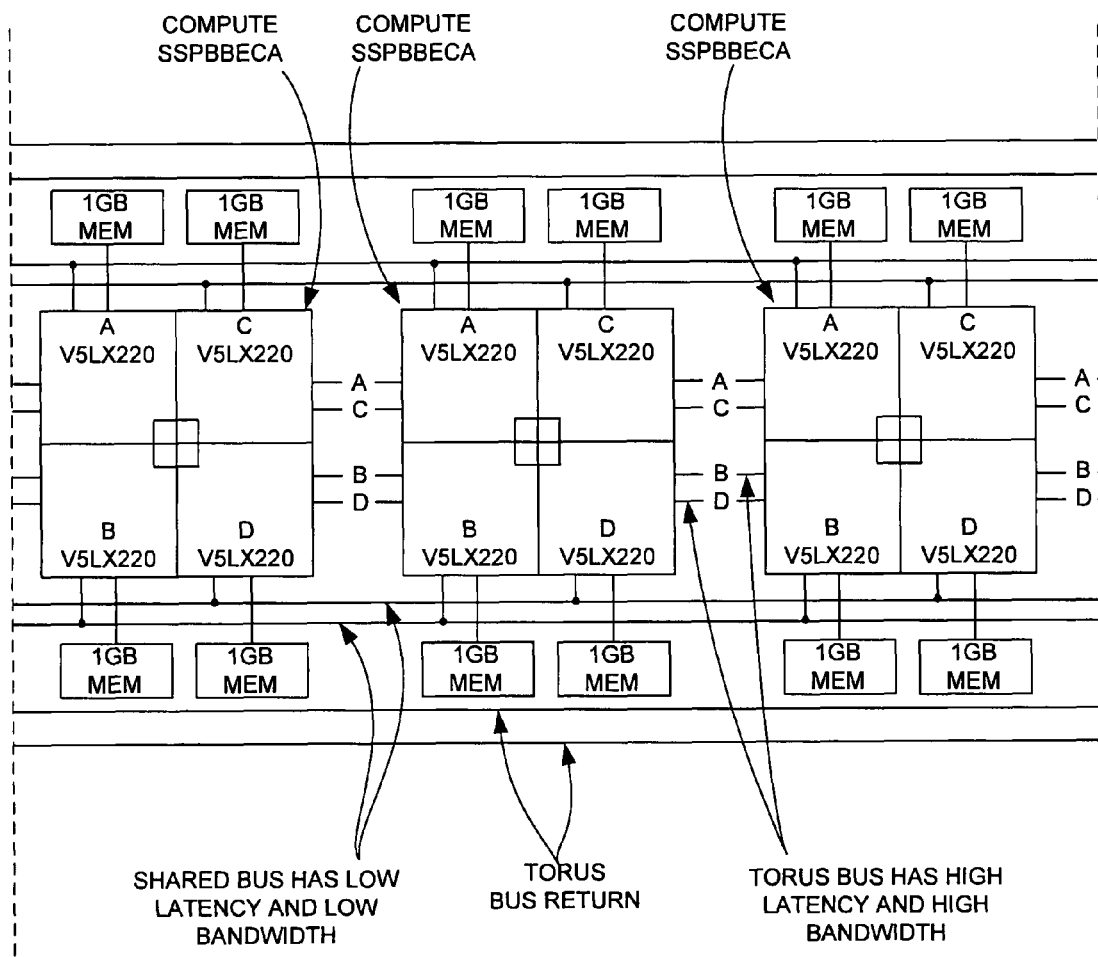

FIG. 34 is a circuit block diagram of the semiconductor substrate stack. The stack 27 of FIG. 16 involves eight SSPBBECAs. Seven of the SSPBBECAs 41-47 are "compute" SSPBBECAs, each involving one semiconductor substrate assembly having four FPGAs and one semiconductor substrate assembly having memory devices. One SSPBBECA 40 is an "input/output" SSPBBECA involving one semiconductor substrate assembly having four FPGAs and one semiconductor substrate assembly having memory devices. On the left of FIG. 34 is the connector PCB 14 that is also illustrated in FIG. 3. Connector PCB 14 is the PCB to which the high speed I/O connectors 9 and the user interface port connector 10 are connected.

Figure 35:
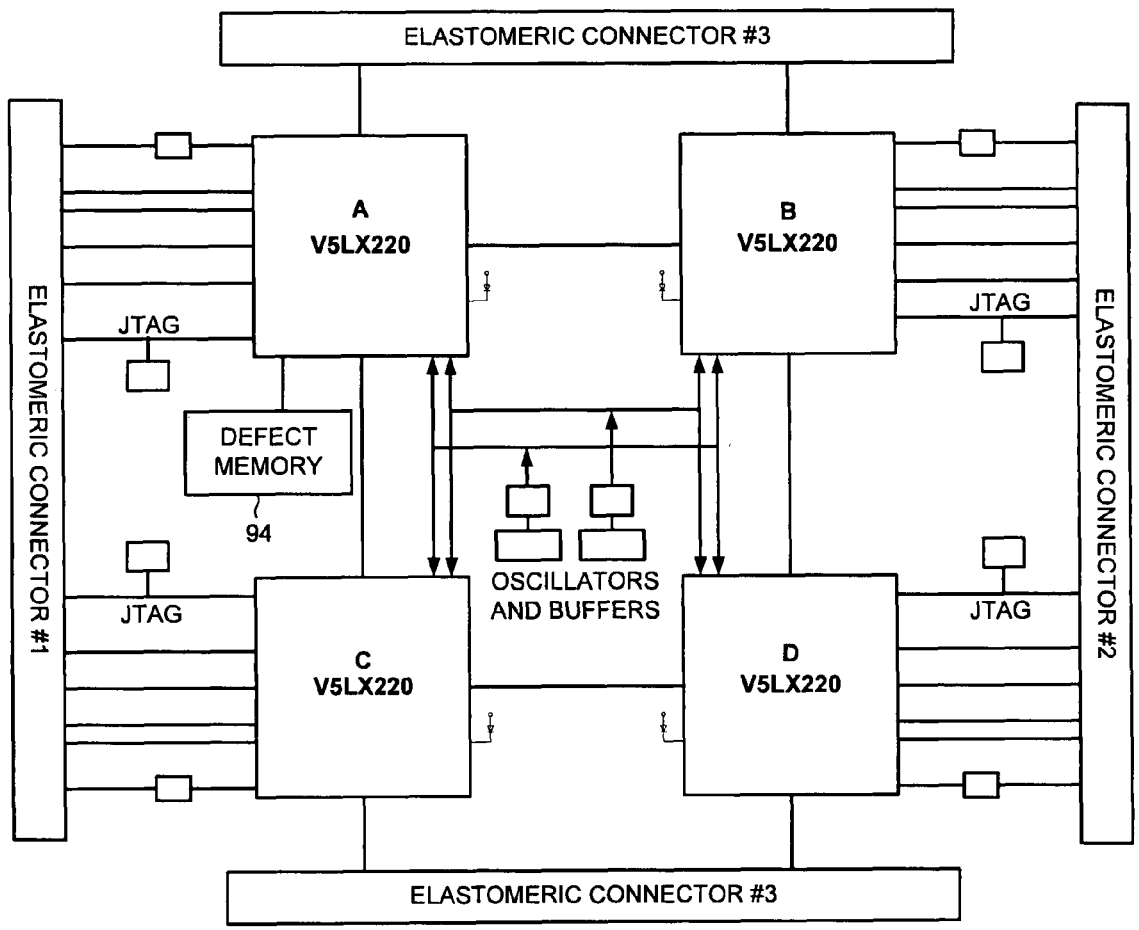
FIG. 35 is a block diagram of one "compute" semiconductor substrate assembly.

FIG. 35 is a block diagram of one of the "compute" semiconductor substrate assemblies of FIG. 34.

Figure 36:
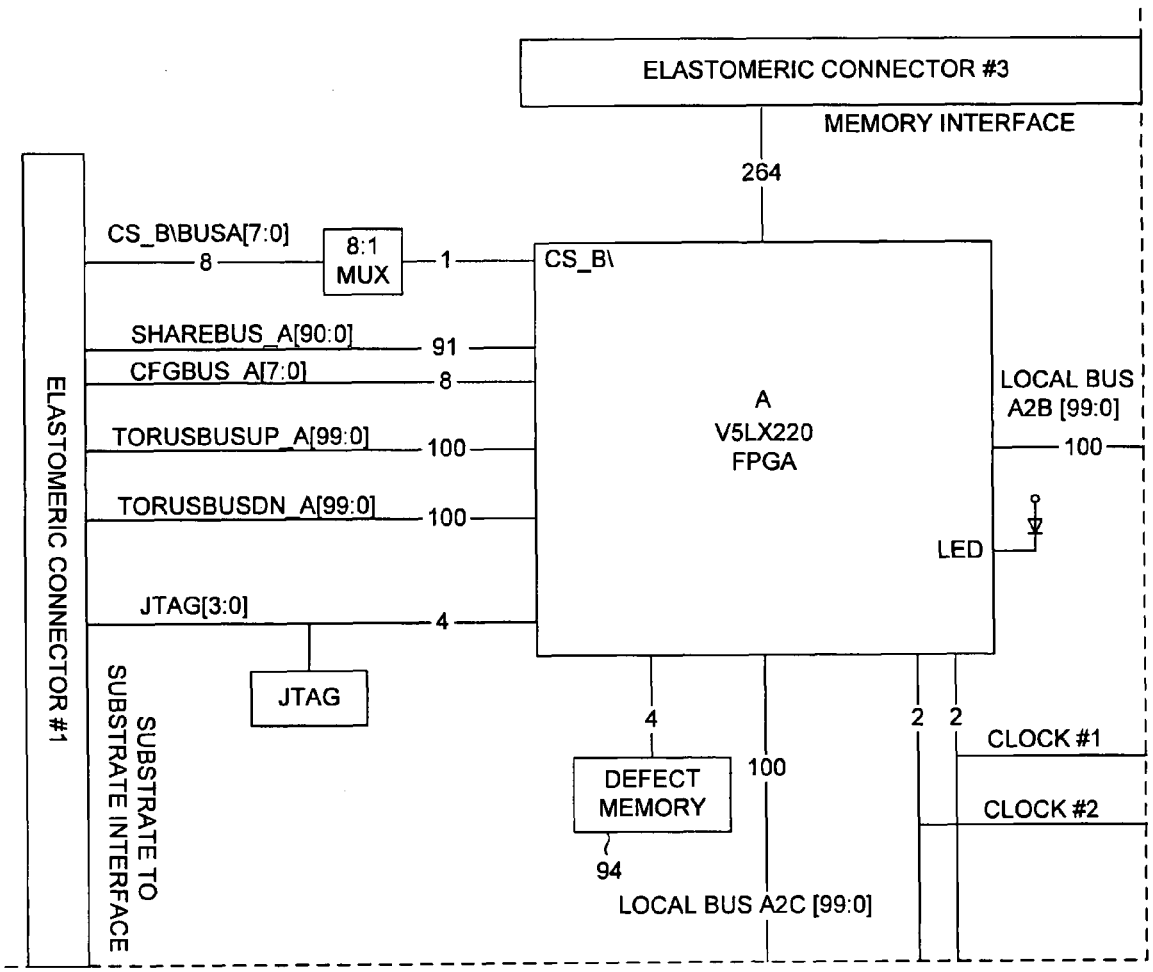
FIG. 36 is a more detailed view of the upper left portion of FIG. 35.

FIG. 36 is a more detailed view of the upper left portion of FIG. 35.

Figure 37:
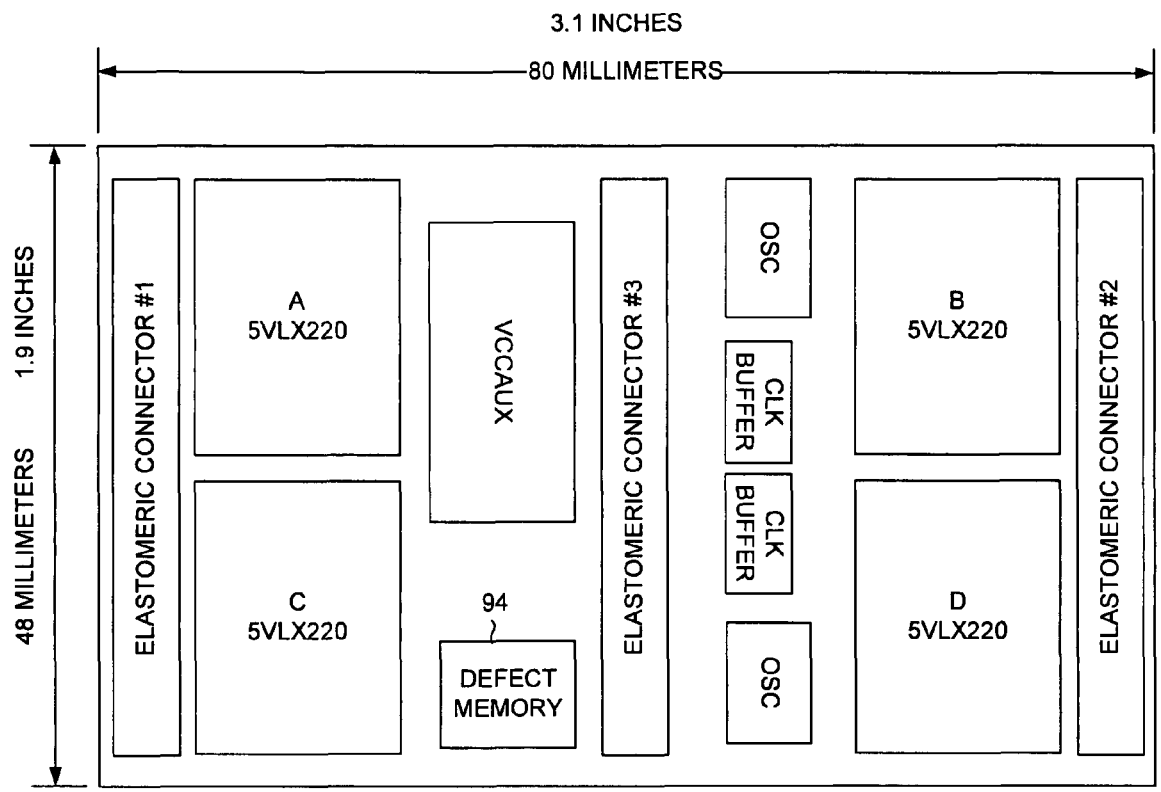
FIG. 37 is a top-down diagram of the physical layout of one of the "compute" semiconductor substrate assemblies.

FIG. 37 is a top-down diagram of the physical layout of one of the "compute" semiconductor substrate assemblies of FIG. 34.

Figure 38:
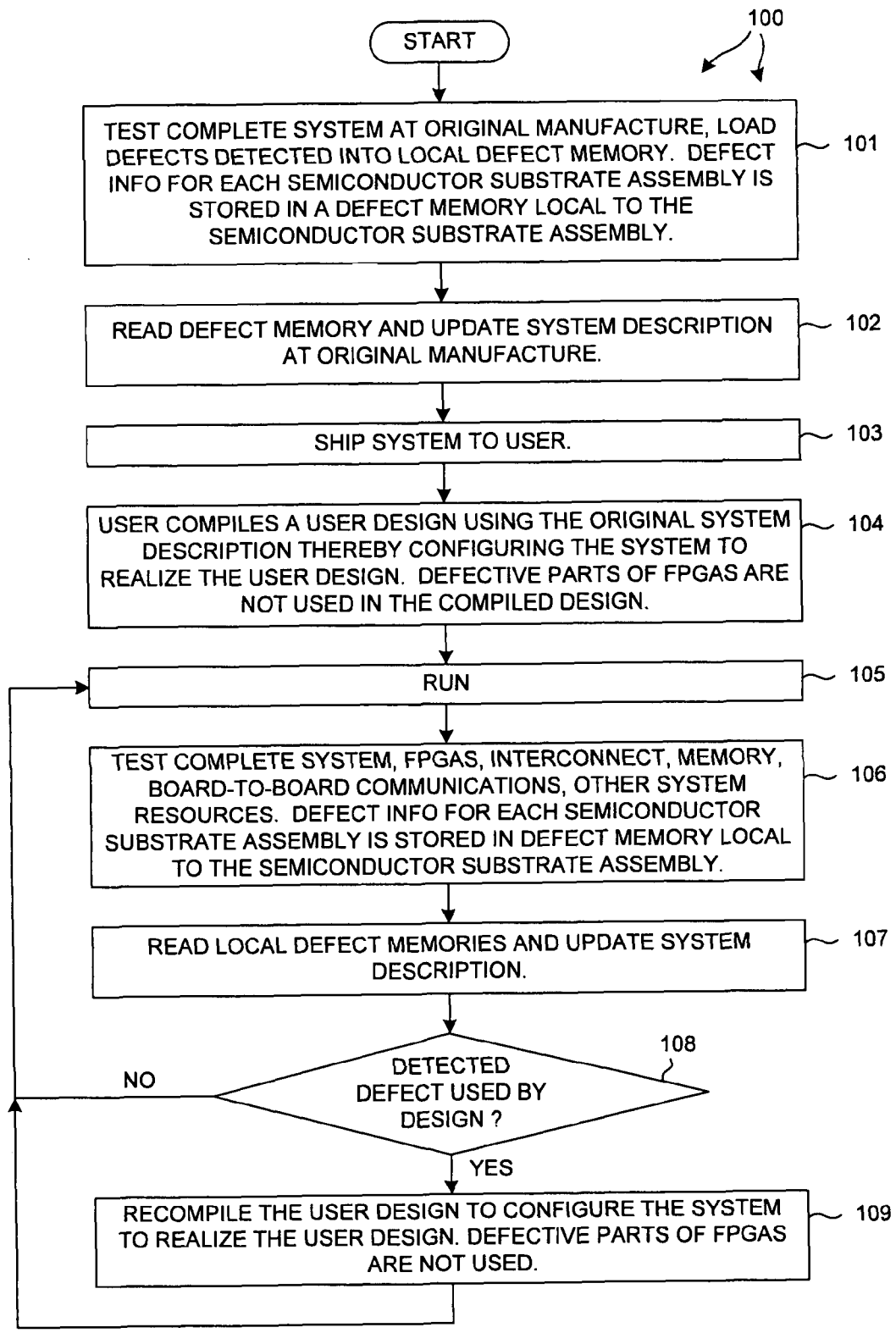
FIG. 38 is a simplified flowchart of a novel method involving local defect memories in accordance with one novel aspect.

FIG. 38 is a simplified flowchart of a novel method 100 involving local defect memories (PROM or FLASH in this example). Each semiconductor substrate assembly has its own local defect memory that stores information about what resources and parts of the semiconductor substrate assembly are defective and which resources and parts are functional. These defect memories are used to facilitate and speed the resumption of running of the high performance computer after a defect is detected. Each semiconductor substrate assembly self-tests itself, and updates defect information stored in its own local defect memory.

In a first step (step 101), the complete computer 1 is tested for defects. More specifically, each semiconductor substrate assembly self-tests itself for: 1) defects within an FPGA, 2) within a memory, 3) within any other integrated circuit disposed on the substrate assembly such as a crystal oscillator module, 4) in any signal conductor extending between integrated circuits of the semiconductor substrate assembly, and 5) in any signal path extending between semiconductor substrates of the SSPBBECA. In addition, each signal conductor of the torus bus (see FIG. 34) and each signal conductor of the shared bus (see FIG. 34) is tested for continuity. If a defect is detected in an FPGA, then additional testing is performed to determine what parts of the FPGA remain functional and which parts are not functional. If a semiconductor substrate assembly detects any defect, then this defect and information about what kind of defect it is and the location of the defect is stored in a defect memory local to the semiconductor substrate assembly. FIGS. 35, 36 and 37 show examples of local defect memories 94. The local defect memories are non-volatile memories such as FLASH memories.

Next (step 102), the defect information stored in all the local defect memories of computer 1 is read and is used to general a system description. This system description may be stored on computer 1 and/or may be stored on a personal computer of other computer coupled to user interface port connector 10.

Next (step 103), computer 1 is shipped or provided to an end user. The end user compiles a user design (step 104) using the system description. Defective parts of the computer 1 are not used in the compiled design. Within an FPGA, if the FPGA is determined to have a defective portion and a functional portion, the functional portion may be used. The result of this step is the configuring of the FPGAs of computer 1.

Next (step 105), the user uses computer 1 to process information or data. Output information and/or data is generated.

Next (step 106), after a period of time the state of computer 1 is saved, and the complete system 1 is tested for defects again. Each semiconductor substrate assembly self-tests itself, as well as associated resources to which it is connected. The semiconductor substrate assemblies update their local defect memories.

Next (step 107), the defect information stored in all the local defect memories of computer 1 is read and is used to update the system description.

Next (step 108), a determination is made as to whether a detected defect is used by the user's design as it had configured computer 1. If no detected defect was used in the user's design, then the computer is reconfigured to realize the user's design, the saved state is reloaded, and execution resumes (step 105) where it left off in step 105. If, on the other hand, a detected defect is determined (step 108) to be used by the user's design, then the user's design is recompiled using the updated system description so that the user's design as recompiled will not utilize any defective portions of computer 1. In one aspect, a defective part of an FPGA is not used as a result of step 109 whereas in the previous running (step 105) of the user's design the defective part of the FPGA was used. Moreover, in the resumed execution, a functional portion of the FPGA is used in the user's design. Method 100 proceeds in this way, periodically testing system resources and updating the system description. If the user's design does not use any newly detected defective portion of the system, then the user's design need not and is not recompiled, but rather is simply reloaded, saved state information is restored, and running of the user's design resumes where it had been stopped before the last test. Providing a local defect memory on each individual semiconductor substrate assembly, where the local defect memory is a non-volatile memory that stores information about which parts of the semiconductor substrate assembly are functional and nonfunctional, facilitates updating the overall system description when individual semiconductor substrate assemblies of stack 27 are removed and/or replaced with other semiconductor substrate assemblies having different functional and non-functional portions.

Figure 39:
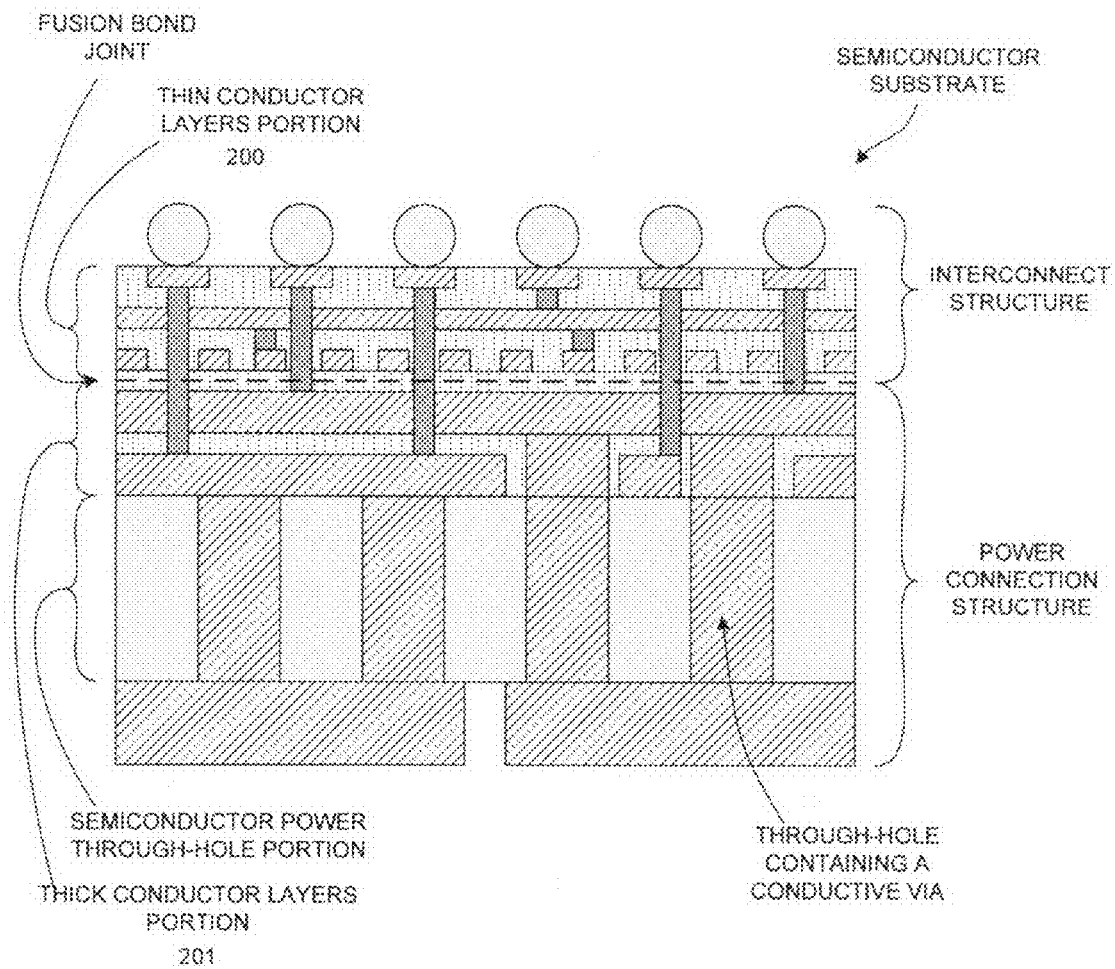
FIG. 39 is a cross-sectional diagram illustrating another novel aspect of high performance computer 1. The semiconductor substrate involves two layer portions: a "thin conductor layers portion" and a "thick conductor layers portion". The two portions are fabricated separately and are then fusion bonded together to form the semiconductor substrate.

FIG. 39 is a cross-sectional diagram illustrating another novel aspect of the high performance computer 1. Each semiconductor substrate involves two layer portions: a "thin conductor layers portion" 200 and a "thick conductor layers portion" 201. The two portions are fabricated separately and are then fusion bonded together to form the semiconductor substrate.

Figure 40:
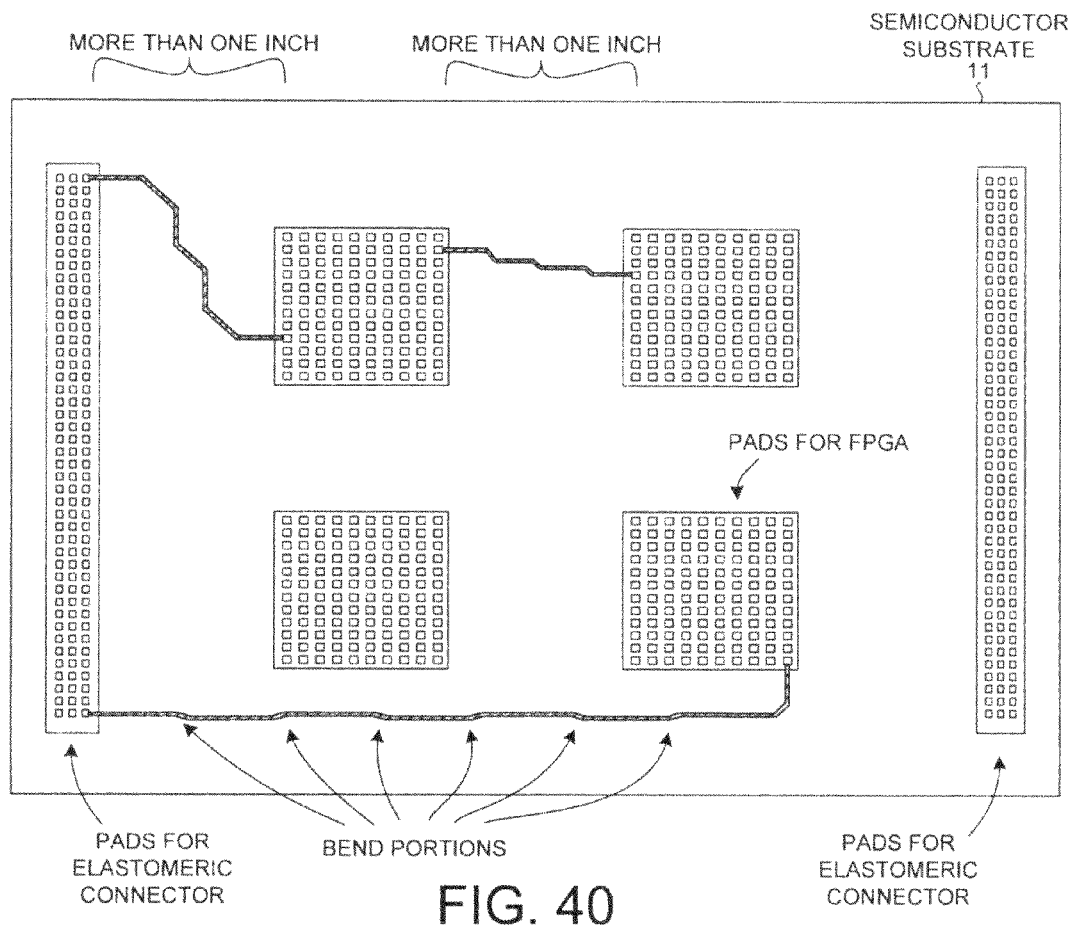
FIG. 40 is a simplified top-down diagram that illustrates another novel aspect of high performance computer 1. Breaking of long metal conductors of a semiconductor substrate is prevented by embedding the long conductors in tubes of soft dielectric material.

FIG. 40 is a simplified top down diagram illustrating another novel aspect of the high performance computer 1. The small squares in the diagram are pads on the top of the semiconductor substrate. The pads for the central elastomeric connector are not illustrated to simplify the illustration. The vertical strip of pads at the left of the diagram is for a first elastomeric connector. The vertical strip of pads at the right of the diagram is for a second elastomeric connector. Breaking of long metal conductors of the semiconductor substrate is prevented by embedding the long metal conductors in tubes of soft dielectric material. As the long metal conductors expand and shrink during temperature cycling, the long conductors bend and straighten within the tubes and move with respect to the semiconductor substrate. The soft dielectric can give and compress and accommodate differential movement between the metal of the conductor and the semiconductor material of the substrate, thereby preventing breakage of the conductors. Bend portions are provided in the metal conductors to facilitate and localize bending due to thermal expansion. The semiconductor substrates of the stack 27 are of this construction.

Figure 41:
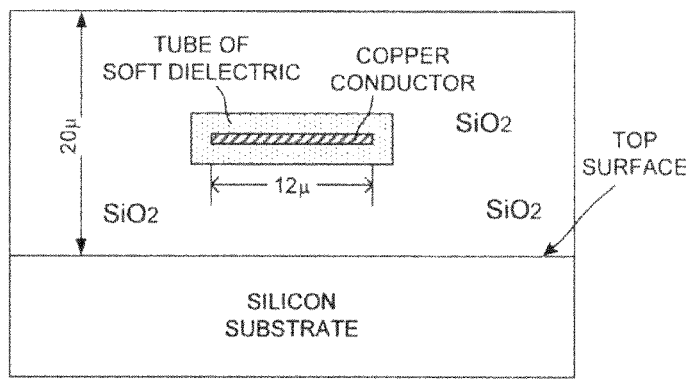
FIG. 41 is a cross-sectional view of one metal conductor of FIG. 40.

FIG. 41 is a cross-sectional view of one metal conductor of FIG. 40. The metal conductor is disposed in a tube of soft low-K dielectric material.

Although certain specific embodiments are described above for instructional purposes, the teachings of this patent document have general applicability and are not limited to the specific embodiments described above. Integrated circuits other than FPGAs and memories can be disposed on some of the semiconductor substrates. For example, a Pentium 3 architecture microprocessor and associated memories and support integrated circuits may be disposed on one semiconductor substrate in the stack. Accordingly, various modifications, adaptations, and combinations of various features of the described embodiments can be practiced without departing from the scope of the invention as set forth in the claims.

What is claimed is:

1. A structure comprising:
   a first semiconductor substrate having a first conductive via, the first conductive via extending through the first semiconductor substrate;
   a second semiconductor substrate having a second conductive via, the second conductive via extending through the second semiconductor substrate;
   a third semiconductor substrate having a third conductive via, the third conductive via extending through the third semiconductor substrate, wherein each of the first, second and third semiconductor substrates is rectangular and has a length and a width, the length being greater than two inches, the width being greater than one inch, and wherein the second semiconductor substrate is horizontally offset from the first and third semiconductor substrates;
a first conductive elastomeric connector strip (CECS) disposed between the first and second semiconductor substrates; and
a second CECS disposed between the second and third semiconductor substrates, such that an electrical connection is established from the first conductive via, through the first CECS, through the second conductive via, through the second CECS, and to the third conductive via.

2. The structure of claim 1, wherein each field programmable gate array (FPGA) of a plurality of FPGA dice is die-bonded directly to the second semiconductor substrate.

3. The structure of claim 2, wherein the electrical connection is one of a plurality of identical electrical connections that extend in parallel from the first semiconductor substrate to the third semiconductor substrate.

4. A method comprising:
   (a) using a first conductive elastomeric connector strip (CECS) to couple a second semiconductor substrate having a second conductive via to a first semiconductor substrate having a first conductive via, wherein the first conductive via extends through the first semiconductor substrate, wherein the second conductive via extends through the second semiconductor substrate, wherein the first semiconductor substrate has planar surface area of greater than two square inches, and wherein the second semiconductor substrate has planar surface area of greater than two square inches; and
   (b) using a second CECS to couple a third semiconductor substrate having a third conductive via to the second semiconductor substrate, wherein the third conductive via extends through the third semiconductor substrate, wherein the second semiconductor substrate is horizontally offset from the first and third semiconductor substrates, wherein the third semiconductor substrate has planar surface area of greater than two square inches, and wherein the first and second conductive elastomeric connector strips are anisotropic conductive elastomeric connector strips.

5. The method of claim 4, further comprising:
   (c) disposing a first power bus bar structure (PBBS) between the first and second semiconductor substrates, wherein the first PBBS contacts both the first and second semiconductor substrates, and wherein the first PBBS is not bonded to either the first or second semiconductor substrate;
   (d) disposing a second PBBS between the first and second semiconductor substrates, wherein the second PBBS contacts both the first and second semiconductor substrates, and wherein the second PBBS is not bonded to either the first or second semiconductor substrate; and
   (e) providing a power supply voltage between the first and second PBBSs.

6. The method of claim 4, further comprising:
forcing the first semiconductor substrate toward the second semiconductor substrate such that the first CECS is compressed between the first and second semiconductor substrates; and
using a crush stop to prevent the first CECS from compressing more than a predetermined amount, wherein the crush stop is disposed between the first and second semiconductor substrates.

7. An apparatus comprising:
   a first semiconductor substrate having a first side and a second side, the first semiconductor substrate having a first thickness extending from the first side to the second side;
   first conductive elastomeric connector strip (CECS) extending in a first direction, the first CECS having a first side and a second side, the first side of the CECS contacting the second side of the first semiconductor substrate;
   a second semiconductor substrate having a first side and a second side, the second semiconductor substrate having a second thickness extending from the first side of the second semiconductor substrate to the second side of the second semiconductor substrate, the first side of the second semiconductor substrate contacting the second side of the first CECS;
   a second CECS extending in a second direction, the second direction being parallel to the first direction, the second CECS having a first side and a second side, the first side of the second CECS contacting the second side of the second semiconductor substrate;
   a third semiconductor substrate having a first side and a second side, the first side of the third semiconductor substrate contacting the second side of the second CECS;
   a first power bus bar structure (PBBS) extending in a third direction, the third direction being parallel to the second direction, the first PBBS having a first side contacting the second side of the first semiconductor substrate, the first PBBS having a second side contacting the first side of the second semiconductor substrate, the first PBBS having a third thickness extending from the first side of the PBBS to the second side of the first PBBS, wherein the third thickness is greater than the first thickness and is greater than the second thickness;
   a second PBBS extending in a fourth direction, the fourth direction being parallel to the third direction, the second PBBS having a first side contacting the second side of the first semiconductor substrate, the second PBBS having a second side contacting the first side of the second semiconductor substrate, the second PBBS having the third thickness extending from the first side of the second PBBS to the second side of the PBBS; and
   a cooling fluid flowing in a fourth direction parallel to the third direction between the second side of the first semiconductor substrate and the first side of the second semiconductor substrate.

8. The apparatus of claim 7, wherein the first CECS is an anisotropic conductive elastomeric connector strip, and wherein the second CECS is an anisotropic conductive elastomeric connector strip.

9. The apparatus of claim 7, wherein the first PBBS is taken from the group consisting of: a braided wire structure, a solid metal bar, a metal tube.

10. The apparatus of claim 7, wherein the first PBBS makes mechanical contact with the first and second semiconductor substrates, but is not bonded to the first and second semiconductor substrates.

11. The apparatus of claim 7, wherein there is a direct current (DC) supply voltage between the first PBBS and the second PBBS.

12. The apparatus of claim 7, wherein a first integrated circuit is disposed on the first side of the first semiconductor substrate, wherein a second integrated circuit is disposed on the second side of the second semiconductor substrate, and wherein the first and second integrated circuits communicate electrical signals through the first CECS.

13. The apparatus of claim 7, further comprising:
a first crush stop having a first side and a second side, the first side of the first crush stop contacting the second side of the first semiconductor substrate, the second side of the first crush stop contacting the first side of the second semiconductor substrate; and
a second crush stop having a first side and a second side, the first side of the second crush stop contacting the second side of the second semiconductor substrate, the second side of the second crush stop contacting the first side of the third semiconductor substrate.

14. The apparatus of claim 7, wherein the apparatus includes more than three semiconductor substrates, wherein each of the semiconductor substrates is rectangular and has a length and a width, the length being greater than two inches, the width being greater than one inch, wherein the semiconductor substrates have intervening conductive elastomeric connector strips and form a stack, the stack having a height of at least one inch, and wherein the stack consumes more than one hundred watts of electrical power.

15. The apparatus of claim 7, further comprising:
a printed circuit board having a first side and a second side; and
a third CECS extending in a fifth direction, the third CECS having a first side and a second side, the first side of the third CECS contacting the second side of the printed circuit board, the second side of the third CECS contacting the first side of the first semiconductor substrate, wherein the fifth direction is parallel to the first direction.

* * * * *